United States Patent
Kim et al.

(10) Patent No.: US 11,675,500 B2
(45) Date of Patent: Jun. 13, 2023

(54) HIGH CAPACITY MEMORY CIRCUIT WITH LOW EFFECTIVE LATENCY

(71) Applicant: SUNRISE MEMORY CORPORATION, Fremont, CA (US)

(72) Inventors: Youn Cheul Kim, Saratoga, CA (US); Richard S. Chernicoff, Mercer Island, WA (US); Khandker Nazrul Quader, Santa Clara, CA (US); Robert D. Norman, Pendleton, OR (US); Tianhong Yan, Saratoga, CA (US); Sayeef Salahuddin, Walnut Creek, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 121 days.

(21) Appl. No.: 17/169,387

(22) Filed: Feb. 5, 2021

(65) Prior Publication Data

US 2021/0247910 A1    Aug. 12, 2021

Related U.S. Application Data

(60) Provisional application No. 62/971,720, filed on Feb. 7, 2020.

(51) Int. Cl.
*G11C 11/00* (2006.01)
*G06F 3/06* (2006.01)
(Continued)

(52) U.S. Cl.
CPC .......... *G06F 3/0611* (2013.01); *G06F 3/0631* (2013.01); *H01L 24/20* (2013.01);
(Continued)

(58) Field of Classification Search
CPC .............................. G06F 3/0611; G06F 3/0631
See application file for complete search history.

(56) References Cited

U.S. PATENT DOCUMENTS

| 4,213,139 A | 7/1980 | Rao |
| 4,984,153 A | 1/1991 | Kregness et al. |

(Continued)

FOREIGN PATENT DOCUMENTS

| CN | 107658317 A | 2/2018 |
| CN | 108649031 A | 10/2018 |

(Continued)

OTHER PUBLICATIONS

"PCT Search Report and Written Opinion, PCT/US2022/15497", dated Jul. 11, 2022, 20 pages.

(Continued)

*Primary Examiner* — Pho M Luu
(74) *Attorney, Agent, or Firm* — Edward C. Kwok; VLP Law Group LLP

(57) ABSTRACT

A first circuit formed on a first semiconductor substrate is wafer-bonded to a second circuit formed on a second memory circuit, wherein the first circuit includes quasi-volatile or non-volatile memory circuits and wherein the second memory circuit includes fast memory circuits that have lower read latencies than the quasi-volatile or non-volatile memory circuits, as well as logic circuits. The volatile and non-volatile memory circuits may include static random-access memory (SRAM) circuits, dynamic random-access memory (DRAM) circuits, embedded DRAM (eDRAM) circuits, magnetic random-access memory (MRAM) circuits, embedded MRAM (eMRAM), or any suitable combination of these circuits.

106 Claims, 24 Drawing Sheets

(51) Int. Cl.
*H01L 23/00* (2006.01)
*H01L 25/18* (2023.01)

(52) U.S. Cl.
CPC ........ *H01L 25/18* (2013.01); *H01L 2224/211* (2013.01); *H01L 2224/214* (2013.01); *H01L 2924/1431* (2013.01); *H01L 2924/1435* (2013.01)

(56) References Cited

U.S. PATENT DOCUMENTS

| | | |
|---|---|---|
| 5,388,246 A | 2/1995 | Kasai |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,057,862 A | 5/2000 | Margulis |
| 6,107,133 A | 8/2000 | Furukawa et al. |
| 6,118,171 A | 9/2000 | Davies et al. |
| 6,130,838 A | 10/2000 | Kim et al. |
| 6,314,046 B1 | 11/2001 | Kamiya et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,284,226 B1 | 10/2007 | Kondapalli |
| 7,307,308 B2 | 12/2007 | Lee |
| 7,489,002 B2 | 2/2009 | Forbes et al. |
| 7,524,725 B2 | 4/2009 | Chung |
| 7,612,411 B2 | 11/2009 | Walker |
| 7,804,145 B2 | 9/2010 | Shimizu et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,417,917 B2 | 4/2013 | Emma et al. |
| 8,630,114 B2 | 1/2014 | Lue |
| 8,653,672 B2 | 2/2014 | Leedy |
| 8,767,473 B2 | 7/2014 | Shim et al. |
| 8,848,425 B2 | 9/2014 | Schloss |
| 8,878,278 B2 | 11/2014 | Alsmeier et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,256,026 B2 | 2/2016 | Thacker et al. |
| 9,297,971 B2 | 3/2016 | Thacker et al. |
| 9,412,752 B1 | 8/2016 | Yeh et al. |
| 9,455,268 B2 | 9/2016 | Oh et al. |
| 9,502,345 B2 | 11/2016 | Youn et al. |
| 9,620,605 B2 | 4/2017 | Liang et al. |
| 9,633,944 B2 | 4/2017 | Kim |
| 9,748,172 B2 | 8/2017 | Takaki |
| 9,799,761 B2 | 10/2017 | Or-Bach et al. |
| 9,842,651 B2 | 12/2017 | Harari |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari et al. |
| 10,217,667 B2 | 2/2019 | Or-Bach et al. |
| 10,217,719 B2 | 2/2019 | Watanabe et al. |
| 10,249,370 B2 | 4/2019 | Harari |
| 10,254,968 B1 | 4/2019 | Gazit et al. |
| 10,283,452 B2 | 5/2019 | Zhu et al. |
| 10,283,493 B1 | 5/2019 | Nishida |
| 10,319,696 B1 | 6/2019 | Nakano |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 10,644,826 B2 | 4/2020 | Wuu et al. |
| 10,692,837 B1 | 6/2020 | Nguyen et al. |
| 10,692,874 B2 | 6/2020 | Harari et al. |
| 10,725,099 B2 | 7/2020 | Ware |
| 10,742,217 B2 | 8/2020 | Dabral et al. |
| 10,978,427 B2 | 4/2021 | Li et al. |
| 11,152,343 B1 | 10/2021 | Dokania et al. |
| 2001/0030340 A1 | 10/2001 | Fujiwara |
| 2001/0053092 A1 | 12/2001 | Kosaka et al. |
| 2002/0028541 A1 | 3/2002 | Lee et al. |
| 2002/0051378 A1 | 5/2002 | Ohsawa |
| 2002/0193484 A1 | 12/2002 | Albee |
| 2004/0043755 A1 | 3/2004 | Shimooka et al. |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2005/0128815 A1 | 6/2005 | Ishikawa et al. |
| 2005/0280061 A1 | 12/2005 | Lee |
| 2006/0080457 A1 | 4/2006 | Hiramatsu et al. |
| 2006/0155921 A1 | 7/2006 | Gorobets et al. |
| 2006/0212651 A1 | 9/2006 | Ashmore |
| 2007/0192518 A1 | 8/2007 | Rupanagunta et al. |
| 2007/0236979 A1 | 10/2007 | Takashima |
| 2008/0022026 A1 | 1/2008 | Yang et al. |
| 2008/0239812 A1 | 10/2008 | Naofumi et al. |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0036960 A1 | 2/2010 | Kowalewski |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0219392 A1 | 9/2010 | Awaya et al. |
| 2010/0254191 A1 | 10/2010 | Son et al. |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0208905 A1 | 8/2011 | Shaeffer et al. |
| 2011/0298013 A1 | 12/2011 | Hwang et al. |
| 2011/0310683 A1 | 12/2011 | Gorobets |
| 2012/0182801 A1 | 7/2012 | Lue |
| 2012/0243314 A1 | 9/2012 | Takashi |
| 2012/0307568 A1 | 12/2012 | Banna et al. |
| 2013/0007349 A1 | 1/2013 | D'Abreu et al. |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0173017 A1 | 6/2014 | Takagi et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0347331 A1 | 12/2015 | Park et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0079164 A1 | 3/2016 | Fukuzumi et al. |

(56) References Cited

U.S. PATENT DOCUMENTS

| | | |
|---|---|---|
| 2016/0086970 A1 | 3/2016 | Peng |
| 2016/0225860 A1 | 8/2016 | Karda et al. |
| 2016/0248631 A1 | 8/2016 | Duchesneau |
| 2016/0300724 A1 | 10/2016 | Levy et al. |
| 2016/0314042 A1 | 10/2016 | Plants |
| 2016/0321002 A1 | 11/2016 | Jung et al. |
| 2017/0077230 A1 | 3/2017 | Ikeda et al. |
| 2017/0092370 A1 | 3/2017 | Harari |
| 2017/0092371 A1* | 3/2017 | Harari ............... G11C 16/0483 |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0061851 A1 | 3/2018 | Ootsuka |
| 2018/0095127 A1 | 4/2018 | Pappu et al. |
| 2018/0108416 A1 | 4/2018 | Harari |
| 2018/0269229 A1 | 9/2018 | Or-Bach et al. |
| 2018/0331042 A1 | 11/2018 | Manusharow et al. |
| 2018/0357165 A1 | 12/2018 | Helmick et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0028387 A1 | 1/2019 | Gray |
| 2019/0043836 A1 | 2/2019 | Fastow et al. |
| 2019/0067327 A1 | 2/2019 | Herner et al. |
| 2019/0121699 A1 | 4/2019 | Cohen et al. |
| 2019/0130946 A1 | 5/2019 | Sim et al. |
| 2019/0148286 A1 | 5/2019 | Or-Bach et al. |
| 2019/0157296 A1 | 5/2019 | Harari et al. |
| 2019/0171391 A1 | 6/2019 | Dubeyko et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0332321 A1 | 10/2019 | Chen |
| 2019/0319044 A1 | 11/2019 | Harari |
| 2019/0348424 A1 | 11/2019 | Karda et al. |
| 2019/0355672 A1 | 11/2019 | Fujita et al. |
| 2019/0355747 A1 | 11/2019 | Herner et al. |
| 2019/0370005 A1 | 12/2019 | Moloney et al. |
| 2019/0370117 A1 | 12/2019 | Fruchtman et al. |
| 2019/0384884 A1 | 12/2019 | Thuries et al. |
| 2020/0006306 A1 | 1/2020 | Li |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0194416 A1 | 6/2020 | Or-Bach et al. |
| 2020/0201718 A1 | 6/2020 | Richter et al. |
| 2020/0227123 A1* | 7/2020 | Salahuddin ......... G11C 11/5635 |
| 2020/0243486 A1* | 7/2020 | Quader ............... G06F 12/0246 |
| 2020/0258897 A1 | 8/2020 | Yan et al. |
| 2020/0326889 A1 | 10/2020 | Norman et al. |
| 2020/0341838 A1 | 10/2020 | Hollis |
| 2020/0395328 A1 | 12/2020 | Fastow et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2022/0043596 A1 | 2/2022 | Madraswala et al. |

FOREIGN PATENT DOCUMENTS

| | | | |
|---|---|---|---|
| JP | 2010108522 A1 | 5/2010 | |
| JP | 2011028540 A1 | 2/2011 | |
| KR | 20120085591 A1 | 8/2012 | |
| WO | 2018236937 A1 | 12/2018 | |

OTHER PUBLICATIONS

"EP Extended Search Report EP168690149.3", dated Oct. 18, 2019.
"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech Dig. of Technical Papers, 2009, pp. 188-189.
Lue, H.T., et al., "A Highly Scalable 8- Layer 3D Vertical-gate {VG} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2021/016964", dated Jun. 15, 2021, 19 pages.
"PCT Search Report and Written Opinion, PCT/US2020/065374", dated Mar. 15, 2021, 17 pages.
"Partial Search Report, European Patent Application No. 20748610.1", dated Sep. 29, 2022, 13 pages.

* cited by examiner

HIGH CAPACITY MEMORY CIRCUIT WITH LOW EFFECTIVE LATENCY

CROSS REFERENCE TO RELATED APPLICATION

The present application is related to and claims priority of U.S. provisional patent application ("Parent Provisional Application", Ser. No. 62/971,720, entitled "High Capacity Memory Circuit With Low Effective Latency," filed on Feb. 7, 2020.

The present application is also related to (i) U.S. non-provisional application ("Non-provisional Application I"), Ser. No. 16/776,279, entitled "Device with Embedded High-Bandwidth, High-Capacity Memory using Wafer Bonding," filed on Jan. 29, 2020, and (ii) U.S patent application ("Non-provisional Application II"), Ser. No. 16/582,996, entitled "Memory Circuit, System and Method for Rapid Retrieval of Data Sets," filed on Sep. 25, 2019; (III) U.S. non-provisional patent application ("Non-provisional Application III"), Ser. No. 16/593,642, entitled "Three-dimensional Vertical NOR Flash Thin-film Transistor Strings," filed on Oct. 4, 2019; (iv) U.S. non-provisional patent application ("Non-provisional Application IV"), Ser. No. 16/744,067, entitled "Implementing Logic Function and Generating Analog Signals Using NOR Memory Strings," filed on Jan. 15, 2020.

The present application is also related to U.S. provisional application ("Provisional Application"), Ser. No. 62/947,405, entitled "Vertical Thin-film Transistor and Application as Bit Line Connector for 3-Dimensional Memory Arrays," filed on Dec. 12, 2019.

The disclosures of Parent Provisional Application. Provisional Application and Non-provisional Applications I-IV are hereby incorporated by reference in their entireties.

BACKGROUND OF THE INVENTION

1. Field of the Invention

The present invention relates to memory circuits and computing systems. In particular, the present invention relates to memory circuits that are very high capacity, while providing a low effective latency comparable to state-of-the-art dynamic random-access memory ("DRAM") circuits and the interactions between memory and computer systems.

2. Discussion of the Related Art

Non-Provisional Applications II and III each disclose high-capacity, 3-dimensional thin-film memory circuits that can be configured as quasi-volatile memory circuits. A quasi-volatile memory circuit, though having a shorter data retention time (e.g., minutes) compared to the data retention time of a non-volatile memory circuit (e.g., years), has faster write and erase operations, greater endurance and lower read latency than conventional non-volatile circuits as well as comparable circuit density. Non-provisional Applications II and III also each disclose forming the quasi-volatile memory circuits as 3-dimensional arrays of thin-film storage transistors over a semiconductor substrate in which is formed analog and digital support circuitry, such as various power supply circuits, drivers, sense amplifiers, word line and bit line decoding circuits, data latches, multiplexers, select transistors and input and output circuits. Some of these circuits may operate at high voltage (e.g., 8.0-16.0 volts), while others operate at medium-voltage (e.g., 2.0-6.0 volts) and low voltages (e.g., 0.6-1.2 volts). In this description, the circuitry formed in the semiconductor substrate underneath the 3-dimensional memory arrays of thin-film storage transistors are generally referred to as "circuitry under array" ("CuA"). Typically, for non-volatile or quasi volatile thin-film memory arrays, the high-voltage circuits are relatively low-density (i.e., large area) circuits, while low-voltage transistors are relatively high density. Among these transistor types, the low-voltage transistors typically have the highest performance (i.e., fastest) and provide densest circuits.

In one disclosed embodiment in Non-provisional Application II, the storage transistors of each 3-dimensional array are organized into parallel stacks of NOR memory strings, with the stack having eight or more NOR memory strings provided one on top of another, separated by a dielectric layer. The storage transistors in each NOR memory string share a common drain region and a common source region. The common drain region of each NOR memory string, also colloquially referred to as a "bit line," extends along a direction parallel to the surface of the semiconductor substrate. Connections to the gate electrodes of the storage transistors are provided by conductors ("word lines") that are shared by numerous NOR memory strings. Each word line extends along a direction substantially perpendicular to the surface of the semiconductor substrate. In this detailed description, the memory arrays of Non-provisional Application II are referred to as HNOR memory arrays, based on their substantially "horizontal" common drain and common source regions.

As disclosed in Non-provisional Application II, the storage transistors in the 3-dimensional memory array form a storage portion ("array portion") and a contact portion ("staircase portion"). The staircase portion is so named because each bit line of each stack of NOR memory strings extends beyond the array portion a successively lesser amount, as the distance between the bit line and the surface of the semiconductor substrate increases, so as.to form a staircase structure. Electrical contacts to the bit lines may be provided at the staircase portion. The staircase portion of each stack of NOR memory strings may have two staircase structures on opposite sides of the array portion.

In one disclosed embodiment in Non-provisional Application III, the storage transistors of each 3-dimensional array are organized into parallel columns of NOR memory strings, with each column having at least one NOR memory string, in which storage transistors share a common drain region and a common source region. The common drain region or bit line of each NOR memory string extends along a direction substantially perpendicular the surface of the semiconductor substrate. In this detailed description, the memory arrays of Non-provisional Application III are referred to as VNOR memory arrays, based on their substantially "vertical" common drain and common source regions. Like the HNOR memory arrays, storage transistors in the 3-dimensional VNOR memory array also form a storage portion ("array portion") and a contact portion ("staircase portion"). The staircase portion of a VNOR memory array provides electrical contacts to the word lines. Electrical contacts to the bit lines may be provided at the staircase portion. The staircase portion of a VNOR memory array may have two staircase structures on opposite sides of the array portion.

Forming thin-film memory arrays over the CuA poses challenges. For example, manufacturing the quasi-volatile and non-volatile memory arrays above the substrate requires high temperature steps ("thermal cycles"). As the CuA is formed first in the substrate, prior to the formation of the quasi-volatile and non-volatile memory arrays, the CuA is also exposed to the thermal cycles. The dense low-voltage logic circuit are particularly susceptible to degradation resulting from exposure to the thermal cycles. For example, sense amplifiers are particularly susceptible to degradation under thermal processing, which adversely impacts their sensitivity and signal integrity. Therefore, the CuA imposes limits on the thermal budget allowable for forming the memory arrays, so as to prevent the thermal cycles from degrading the performance of the high-performance, low-voltage and other types of transistors in the CuA. High-voltage and medium-voltage circuits, generally speaking, can withstand the thermal cycles without experience any significant adverse effects.

The large number of manufacturing steps required to form both the CuA and the memory circuits adversely affects the potential yield and performance. Non-provisional Application I discloses an integrated circuit formed by wafer-level hybrid bonding of semiconductor dies. Using wafer-level or chip-level hybrid bonding, a memory circuit and its related CuA ("memory chip") and a logic circuit ("companion chip") may be independently fabricated on separate semiconductor substrates and brought together by interconnecting through aligned hybrid bonds provided on their respective bonding surfaces. In this detailed description, the term "bond" or "bonding" may refer to any wafer-level bonding techniques, chip-level bonding, or any combination of wafer-level bonding and chip-level bonding (e.g., wafer-to-wafer hybrid bonding, chip-to-chip hybrid bonding and chip-to-wafer hybrid bonding). Non-provisional Application I shows that such a combination not only alleviates challenges in the fabrication steps, the combination may give rise to both higher performance in memory circuits and new applications of memory circuits not previously possible.

U.S. Patent Application Publication 2019/0057974, entitled "Hybrid Bonding Contact Structure Of Three-Dimensional Memory Device" ("Lu") by Z. Lu et al, filed on Jul. 26, 2018, discloses a 3-dimensional (3-D) NAND memory device formed by bonding two semiconductor substrates. In Lu, a 3-D NAND memory array is fabricated above the planar surface a first substrate and "peripheral circuits" are fabricated on the second substrate. The two substrates are bonded using in a "flip-chip" fashion using hybrid bonds. Just below the bonding surface of each substrate, Lu teaches forming an interconnection structure, such that, when the two substrates are bonded, the hybrid bonds connect the two interconnection structures together to form an interconnection network that connects the peripheral circuits and the 3-D NAND memory array.

Lu discloses that the peripheral circuits formed on the second substrate includes "a page buffer, a decoder (e.g., a row decoder and a column decoder), a latch, a sense amplifier, a driver, a charge pump, a current or voltage reference, or any active or passive components of the circuits (e.g., high-voltage and low-voltage transistors, diodes, resistors, or capacitors). In some embodiments, the one or more peripheral circuits can be formed on second substrate 510 using complementary metal-oxide-semiconductor (CMOS) technology (also known as a "CMOS chip")" (Lu, at paragraph [0125]). Note that, page buffers, decoders and sense amplifiers are low-voltage logic circuits that can take best advantage of the best performance of the advanced manufacturing process nodes, as discussed above. Drivers, charge pumps, current or voltage references are often medium-voltage and high-voltage analog circuits that are required in a 3-D NAND memory circuit, for example, for generating programming, erase, read and inhibit voltages. The medium-voltage or high-voltage circuitry are generally not as scalable as the low-voltage circuitry, making them less cost-effective when manufactured under advanced manufacturing process nodes. In addition, a multi-oxide CMOS technology is required to accommodate both high-voltage and low-voltage transistors on the same chip. Such a process compromises the scaling and the performance in the low-voltage transistors that would otherwise be possible. Thus, by placing both high-voltage, medium-voltage, and low-voltage circuits on the second substrate, Lu's peripheral circuits can only be manufactured on the second substrate using a manufacturing process that is capable of forming all of the low-voltage logic circuits and the medium-voltage and high-voltage analog circuitry, thus compromising both the high-voltage and low-voltage transistors. Lu's approach prevents the low-voltage logic circuits from taking advantage of the better performance and circuit density in the more advanced manufacturing process nodes.

SUMMARY

According to one embodiment of the present invention, a first circuit formed on a first semiconductor substrate is bonded to a second circuit formed on a second semiconductor substrate, wherein the first circuit includes quasi-volatile or non-volatile memory circuits and wherein the second memory circuit includes faster memory circuits than the quasi-volatile or non-volatile memory circuits. Such faster memory circuits may be volatile or non-volatile memory circuits. The faster memory circuits may include static random-access memory (SRAM) circuits, dynamic random-access memory (DRAM) circuits, embedded DRAM (eDRAM) circuits, magnetic random-access memory (MRAM) circuits, embedded MRAM (eMRAM) circuits, spin-transfer torque MRAM (ST-MRAM) circuits, phase-change memory (PCM), resistive random-access memory (RRAM), conductive bridging random-access memory (CBRAM), ferro-electric resistive random-access memory (FRAM), carbon nanotube memory, or any suitable combination of these circuits. Bonding the first and the second circuits may be accomplished using conventional techniques, such as wafer-level or chip-level hybrid bonding.

The integrated circuit of the present invention make possible many new applications because of high data density, high endurance and high-speed access achievable by the quasi-volatile memory circuit on the memory chip, while the faster memory circuits on the companion chip provide even faster access times, the combination resulting effectively in a high-density, low-latency memory circuit, essentially a heterogeneous memory with advantages that can be exploited in new applications. For example, the integrated circuit of the present invention is particularly suitable for in-memory computing or near-memory computing applications.

The present invention is better understood upon consideration of the detailed description below in conjunction with the accompanying drawings.

DETAILED DESCRIPTION OF THE PREFERRED EMBODIMENTS

Figure 1A:
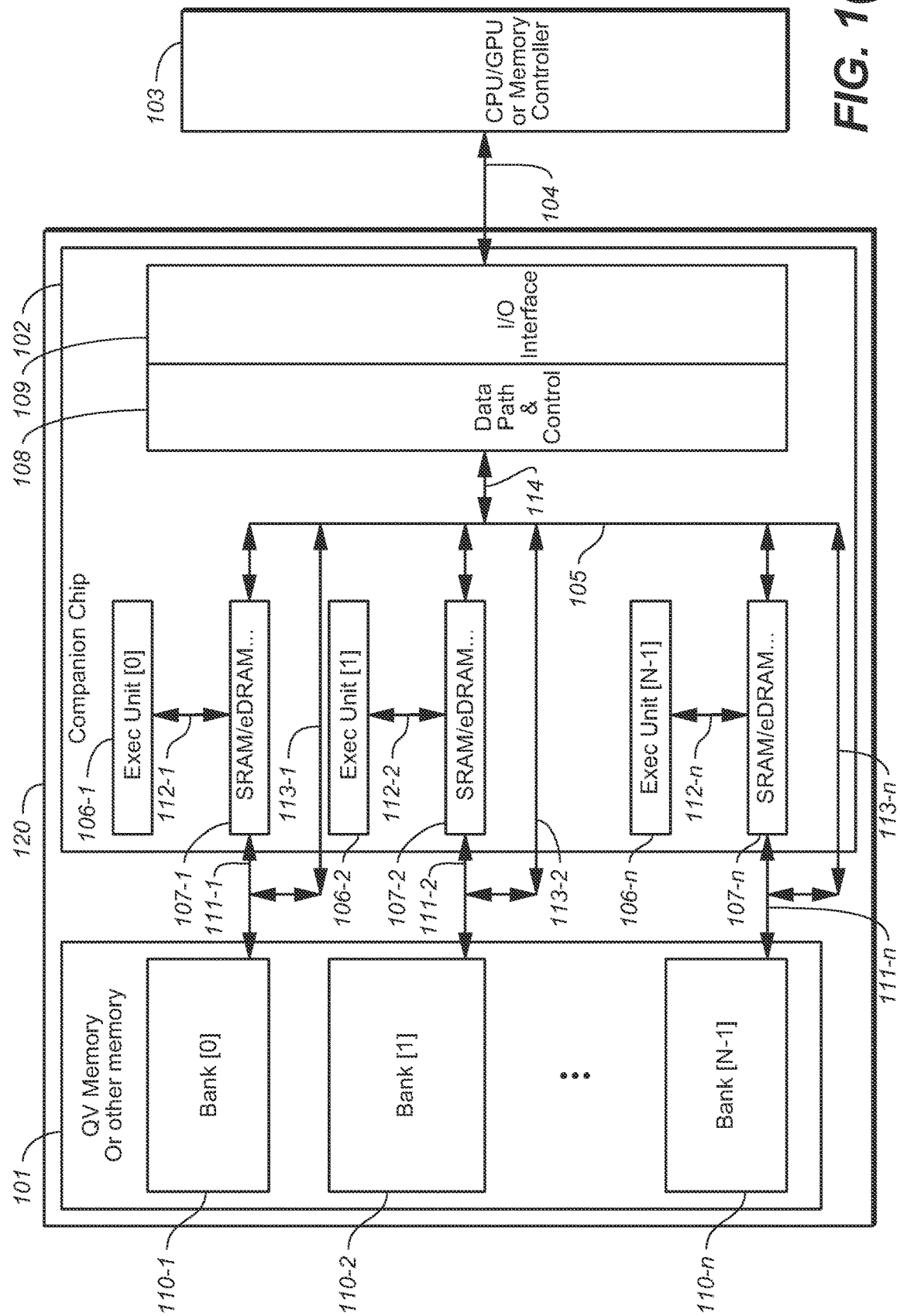
FIG. 1(a) shows integrated circuit 120—which includes memory chip 101 and companion chip 102, interconnected by hybrid bonds—operating under control or supervision by host processor 103, according to one embodiment of the present invention.
Figure 1B:
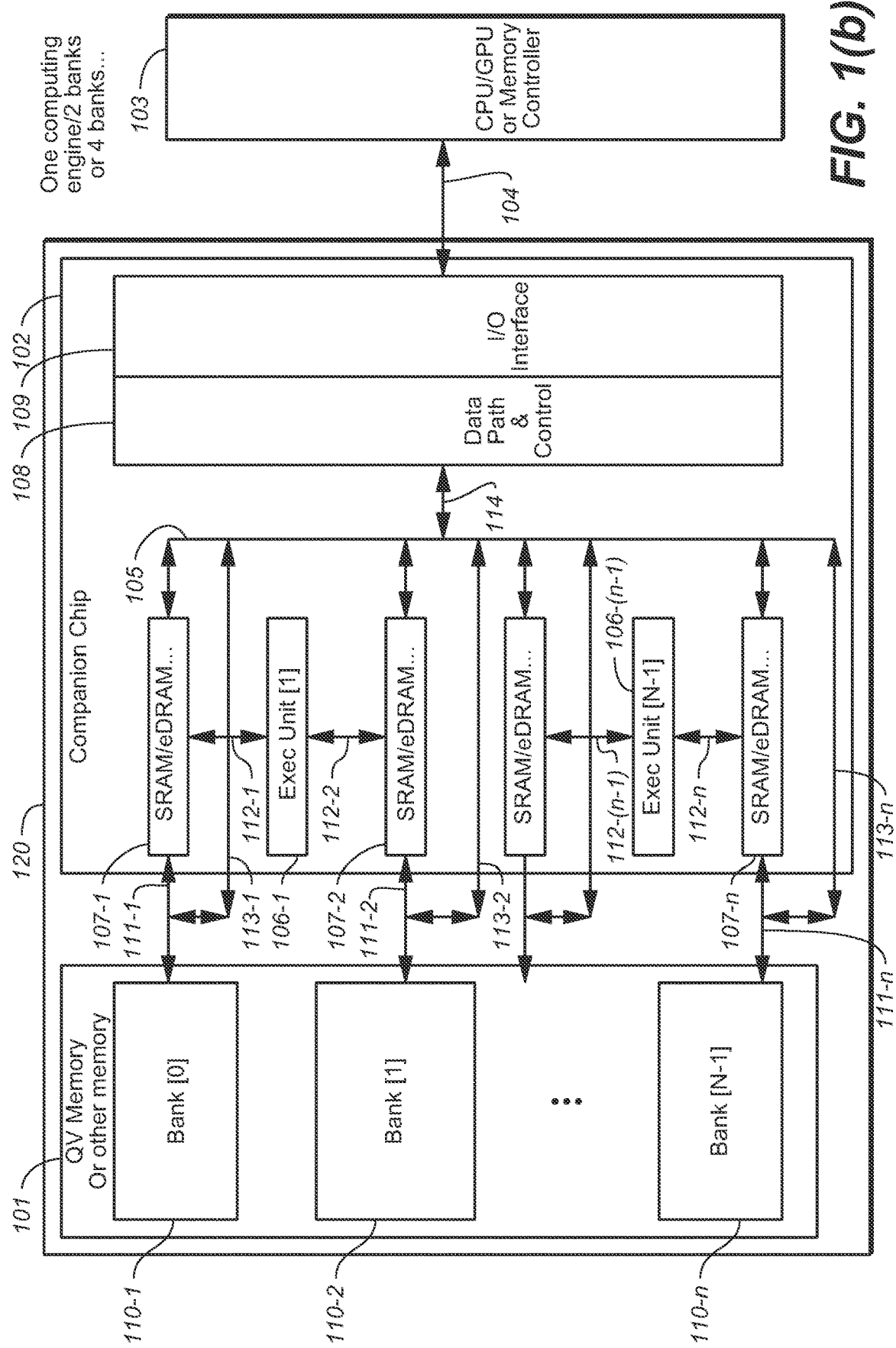
FIG. 1(b) illustrates an alternative implementation of integrated circuit 120, in which each of modularized logic circuits 106 is provided access to two of fast memory circuits 107, in according to one embodiment of the present invention.
Figure 1C:
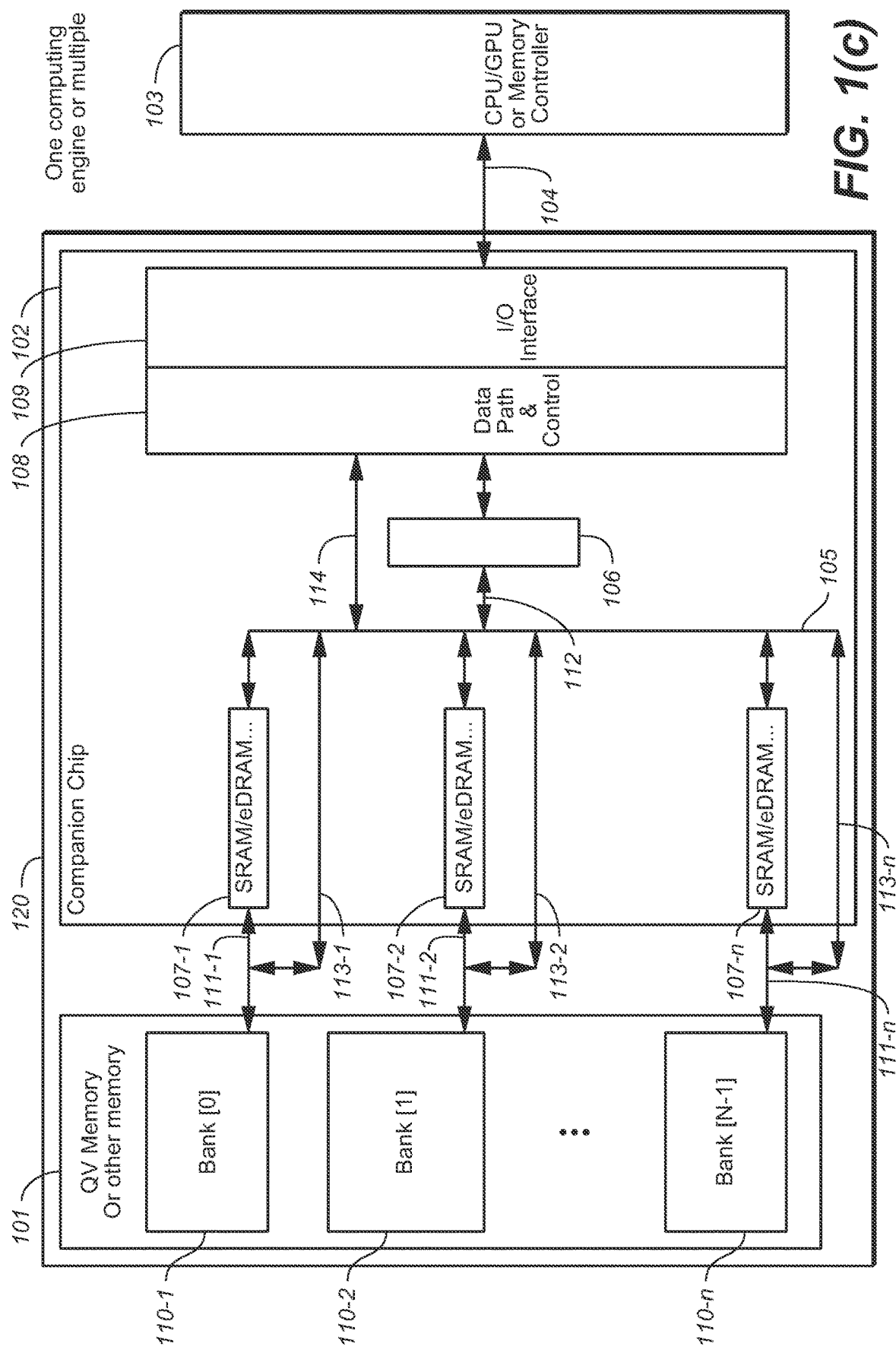
FIG. 1(c) illustrates another alternative implementation of integrated circuit 120, in which single modularized logic circuit 106 is provided access to each of fast memory circuits 107, in according to one embodiment of the present invention.
Figure 1D:
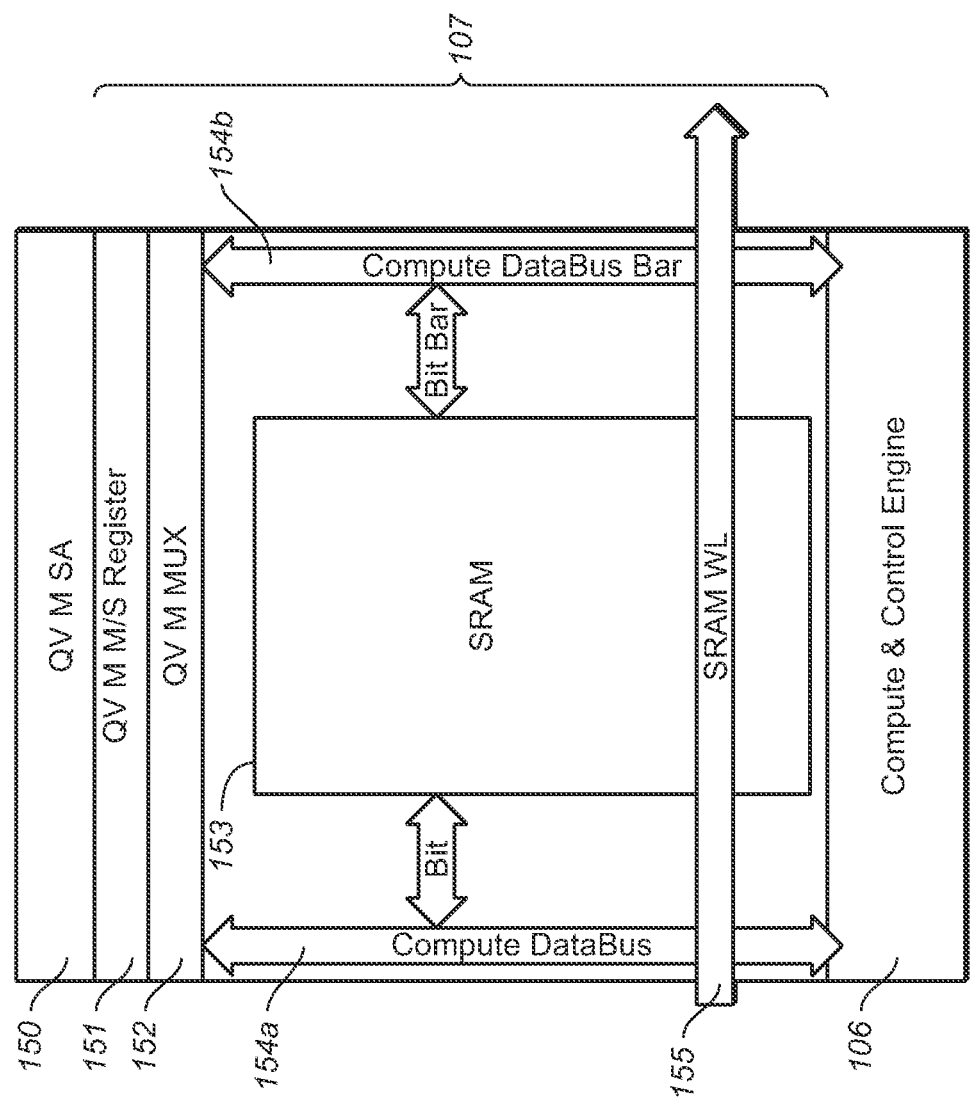
FIG. 1(d) shows a functional a representation of one of fast memory circuits 107, according to one embodiment of the present invention.

According to one embodiment of the present invention, an integrated circuit may be formed by combining high-density, quasi-volatile memory circuits, or non-volatile memory circuits, formed on a first semiconductor die ("memory chip"), and faster memory circuits (e.g., SRAM, DRAM, eDRAM, MRAM, eMRAM, PCM or any other suitable memory circuits) formed on a second semiconductor die ("companion die"). The quasi-volatile memory circuits or the non-volatile memory circuits on the memory chip are preferably built for high density, such as achieved through three-dimensional construction. In contrast, the faster memory circuits on the companion chip are preferably built for high performance, such as achieved through more advanced logic process nodes. The memory chip and the companion chip may be brought together by high-density hybrid bonding, for example.

Of importance, in one embodiment of the present invention, both the memory chip and the companion chip are organized in modular blocks, which are colloquially referred to as "tiles." In that embodiment, the tiles of the memory chip and the tiles of the companion chip have a one-to-one to correspondence. Each tile area in the companion chip—which is equivalent in area to a corresponding tile in the memory chip—provides the sense amplifiers and other logic support circuitry for the quasi-volatile memory circuits in the corresponding tile. In addition, each tile in companion chip includes fast memory circuits (e.g., SRAM circuits) placed within specific "pocket" areas on the tile. As a result, the corresponding tiles in the memory chip and the companion chip form a very high-density, very low-latency heterogeneous memory circuit (i.e., the three-dimensional construction of the memory circuits of the memory chip (e.g., quasi-volatile memory circuits) provides the high density, and the fast memory circuits providing very low-latency (e.g., SRAM circuits).). The memory circuits on the memory chip may include 3-D NAND, 3-D PCM, 3-D HNOR memory, 3-D VNOR memory or other suitable non-volatile or quasi volatile memory circuit types. The memory circuits on the companion chip may include volatile memory circuits (e.g. SRAM or DRAM), or high-performance, non-volatile memory circuits (e.g. MRAM, ST-MRAM or FRAM), or any suitable combination of these types of memory circuits.

According to one embodiment of the present invention, high-performance, low-voltage transistors are provided on the companion chip, rather than the memory chip, so as (i) to avoid degradation of the high-performance, low-voltage logic transistors during thermal cycles in the manufacturing of the memory arrays on the memory chip, and (ii) to benefit from advanced manufacturing nodes optimized for their production. As the low-voltage transistors form sense amplifiers, registers or data latches, high-performance data path circuits, input and output interfaces, error-correction circuits (ECCs), and fast logic circuits (e.g., the low-voltage decoders and multiplexers, state machines and sequencers, and input and output circuits) that can best take advantage of manufacturing process nodes that are one or more generations more advanced—albeit more costly—than the manufacturing process nodes that are capable of also manufacturing the high-voltage and medium-voltage transistors. In addition, depending on the intended application or the desired manufacturing technology, the memory chip may be hybrid bonded to a companion chip specifically configured for that intended applications, or may be manufactured using that manufacturing process (e.g., a sufficiently advanced or cost-effective CMOS manufacturing process node). High-performance, low-voltage transistors are particularly susceptible to degradation during the thermal cycles in the manufacturing of the memory arrays. De-coupling the low-voltage transistors from the high-voltage and medium-voltage transistors by fabricating them on different chips provides an advantageous solution.

In one embodiment, while the medium-voltage and the high-voltage transistors are manufactured as CuA in the memory chip using, for example, 65-nm to 28-nm minimum design rules, the high-performance, low-voltage transistors on the companion chip may be implemented with the much faster and much denser 28-nm to under 5-nm low voltage-only design rules. Under this scheme, the companion chip not only provides the conventional support circuitry for the memory arrays in the memory chip, the density achievable using the more advanced manufacturing nodes allows inclusion of other circuitry (e.g., SRAM circuits, arithmetic and logic circuits, reduced instruction set computers (RISCs), and other suitable logic circuits) that may be effective, for example, in in-memory computation or near-memory applications. In addition, by providing low-voltage circuits in the companion chip, the CuA on the memory chip need only provide high voltage and medium-voltage transistors, thereby allowing the memory chip to benefit from both a reduced die-size and a simpler manufacturing process, thereby resulting in a higher yield.

In this embodiment, both the word line-related circuits and their connections reside in the memory chip, without requiring word line-related hybrid-bond connections to the companion chip. Without such word line-related hybrid bond connections, the number of hybrid bonds required by this embodiment of the present invention is necessarily significantly less than that required by Lu's 3-D NAND memory device, discussed above, which requires hybrid bond connections for all word line signals and all bit line signals to be received into or generated from support circuits (e.g., signal decoders) in the companion chip. The interconnection layers in the companion chip route the signals to and from the circuitry in substrate of the companion chip. Routing both word line-related and bit line-related signals to the companion chip thus results in leaving few hybrid bonds and routing tracks in the companion chip available for other signals or other uses. This problem is avoided in the present invention.

One embodiment of the present invention may be illustrated by FIG. 1(a). FIG. 1(a) shows integrated circuit 120—which includes memory chip 101 and companion chip 102, bonded together (e.g., using hybrid bonding)—operating under control or supervision by host processor 103. (Other suitable bonding techniques include, for example, micro-bump or direct interconnect bonding.) In the detailed description below, bonded integrated circuit 120 may be referred to as a "memory chipset." Host processor 103 may be, for example, a conventional central processing unit (CPU), a graphics processing unit (GPU), a field programmable gate array (FPGA) or a memory controller. As shown in FIG. 1(a), memory chip 101 may include any quasi-volatile or non-volatile memory circuit, e.g., any of the types described in the Non-provisional Applications II and III. Examples of these quasi-volatile memory circuits include HNOR memory string arrays and VNOR memory string arrays. The quasi-volatile memory circuit may include numerous 3-dimensional arrays of thin-film storage transistors formed above a monocrystalline semiconductor substrate. The semiconductor substrate may also have formed therein suitable support circuitry (CuA), such as voltage sources for generating signals used in reading, programming or erase operations. As described below, low-voltage, fast logic circuits, sense amplifiers and other support circuitry for the quasi-volatile memory circuit may be implemented in companion chip 102.

The high-density memory arrays on memory chip 101, when implemented using quasi-volatile memory circuits, provide the benefit of high endurance. In read-intensive applications, however, the high-density memory arrays on memory chip 101 may be implemented by non-volatile memory circuits, or a combination of quasi-volatile memory circuits and non-volatile memory circuits. In that combination, non-volatile memory circuits are used to store data that is rarely changed and for which long-term retention is more important than high endurance. Examples of three-dimensional non-volatile and quasi-volatile memory circuits that can be used on memory chip 101 are described, for example, in Non-provisional Applications II and III.

Companion chip 102 may include fast memory circuits 107, shown in FIG. 1(a) as modularized fast memory circuits 107-1, 107-2, . . . , 107-n. Support circuitry for the quasi-volatile memory circuits and fast memory circuits 107 on companion chip 102 may be interconnected to the CuA on memory chip 101 using hybrid bonds. FIG. 1(a) shows each of the modularized fast memory circuits tightly coupled to corresponding memory tiles of memory chip 101. For example, in memory chip 101, memory banks 110-1, 110-2., . . . 110-n (i.e., memory banks bank[0], bank[1], . . . , bank[n]), each of which may be a bank of quasi-volatile or non-volatile memory cells, are shown connected in close physical proximity, respectively, to modularized fast memory circuits 107-1, 107-2, ..., 107-$n$ by, for example, hybrid bonds 111-1, 111-2, ..., 111-$n$. In one embodiment, each modularized fast memory circuit on companion chip 102 is tightly coupled to a corresponding memory tile in memory chip 101. Therefore, modularized fast memory circuits 107 become integral to the corresponding quasi-volatile or non-volatile memory banks 110. In a practical implementation, memory chip 101 and companion chip 102 would be bonded to each other such that the least resistance result in the conductors (e.g., hybrid bonds 111) between memory banks 110 in memory chip 101 and fast memory circuits 107 on companion chip 101. As shown in FIG. 1($a$), logic circuits 106 may also be modularized and laid out as modularized logic circuits 106-1, 106-2, ..., 106-$n$, each being associated through close proximity and a corresponding one of low resistivity interconnect conductors 112-1, 112-2, ..., 112-$n$ with a corresponding one of modularized fast memory circuits 107-1, 107-2, ..., 107-$n$, which support the operations of their respective modularized logic circuits. Modularized logic circuits 106-1, 106-2, ..., 106-$n$ may be any suitable logic circuits, such as multiplexers, adders, multipliers, Boolean logic operators, RISC processors, math-coprocessors, and FPGAs. Such modularized logic circuits 106 operating in conjunction with their associated modularized memory circuits 107 form what are sometimes referred to as "in-memory compute" elements. In-memory compute elements provide computational operations that are dominant in neural networks widely used in many machine learning, classification, and other artificial intelligence (AI) applications. In one embodiment, the computational complexity required of each of logic circuits 106 may be sufficient to call for implementing an embedded processor (e.g. a RISC processor, a math co-processor, or a micro-controller.

As shown in FIG. 1($a$), other control circuitry and data paths, indicated generally as control and data circuits 108 may also be provided. Control and data circuits 108, logic circuits 106, volatile memory 107 and, through bonding pads of hybrid bonds 111, circuitry on memory chip 101 are interconnected on companion chip 102 through various interconnect conductors 112, 113 and 114, and interconnection fabric 105. Companion chip 102 communicates with host processor or controller 103 over input and output interface circuits 109. Processor or controller 103 may be provided on a separate integrated circuit. Input and output interface 104 may be an industry-standard memory interface (e.g., DDR4, DDR5, or PCIe), through-silicon vias (TSVs), micro-bump or direct interconnects, or a second set of hybrid bonds.

In this embodiment, the 3-dimensional memory arrays and their associated CuA in memory chip 101 are organized in modular building blocks that are colloquially referred to as "tiles," which are laid out over the semiconductor substrate in a 2-dimensional formation. Each tile may implement one or more 3-dimensional memory arrays, and the bit lines and the word lines used to access the tile's memory arrays. As the word lines and the bit lines to access the tile's 3-dimensional memory arrays are provided within the tile, their necessarily short lengths incur significantly less impedance than if they were routed over longer distances over the semiconductor die. The lesser impedance facilitates lower read and write latencies to the memory cells in the memory array. In earlier tile implementations, the control circuitry, including drivers, decoders, multiplexers are provided in the CuA under the tile's memory arrays. However, as mentioned above, a portion of the control circuitry (e.g., the sense amplifiers, registers and data latches) is provided in companion chip 102, thereby significantly reducing the area required for the tile's CuA. In this embodiment, the reduced area required to implement the CuA also result in a smaller tile.

In addition, the tiles may be organized into memory banks, with each bank having multiple rows of tiles and being addressable together by the same group of word lines. In one implementation, each row may have 18 tiles, each handling $2^{10}$ bits ("1 kbits") of data input or output at a time, so as to handle a page of $2^{11}$ Bytes ("2-KByte") of user data plus overhead (e.g., providing limited error correction and redundant spare tile capabilities). Some control structure (e.g., column or bit line decoders) may be shared among groups of multiple banks ("bank groups"). In one implementation, each bank group may be configured to have 2, 4, 8 or 16 banks.

In FIG. 1($a$), modularized logic circuits 106-1, 106-2, ..., 106-$n$ are each provided direct access through one of interconnect conductors 112-1, 112-2, ..., 112-$n$ to a respective one of fast memory circuits 107-1, 107-2, ..., 107-$n$. Depending on the computational need of a desired application, e.g., the computational power requirement on the modularized logic circuit 106, or the nature of the data to be stored in fast memory circuits 107, it may be more effective to have other organizations. For example, FIG. 1($b$) shows an organization in which modularized logic circuits 106-1, 106-2, ..., 106-($n$–1) are each provided direct access through two of interconnect conductors 112-1, 112-2, ..., 112-$n$ to a respective two of fast memory circuits 107-1, 107-2, ..., 107-$n$. Alternatively, in FIG. 1($c$), single modularized logic circuit 106 is provided direct access through interconnect conductors 112 and interconnection fabric 105 to each of fast memory circuits 107-1, 107-2, ..., 107-$n$. Of course, the alternative configurations of FIGS. 1($a$)-1($c$) are not exhaustive, many variations and modifications are possible, based on the requirements of the desired application.

FIG. 1($d$) shows a functional a representation of one of fast memory circuits 107, according to one embodiment of the present invention. FIG. 1($d$) shows sense amplifiers 150, which represents the sensed data values retrieved from a corresponding bank in quasi-volatile memory in memory chip 101 over hybrid bonds 110. In each read activation cycle, each bank in memory chip 101 delivers to sense amplifiers 150 a fixed number of bits from each tile (e.g., 1024 bits). The data values are latched into master-slave register 151, which allow the activated data to be held in the slave latch of master-slave register 151, while the master latch of master-slave register 151 can be used for receiving data values from the next activation. Multiplexer 152, in turn, selects a predetermined number of bits from the slave latch and place the selected bits onto compute data bus 154—composed of true bus 154$a$ and complement bus 154$b$, representing each bit in true and complement forms. Each bit and its complement on compute data bus 154 appears on the true and complement bit lines of a memory cell in fast memory array 153 (e.g., an SRAM array). Fast memory array 153 is mapped to the address space of the quasi-volatile memory, as seen from host processor 103, for example. (As discussed below in conjunction with FIGS. 5$a$ and 5$b$, SRAM array 153 may reside in a set-aside portion of the address space, if desired). Word lines 155, when enabled, write the data on compute data bus 154 into corresponding memory cells of fast memory array 153.

Memory array 153 may be used as a bit-by-bit multiplier (without carry) which multiples a first operand represented by the bits of word lines 155 and a second operand represented by the selected bits from the slave latch of master-slave register 151. For example, in a matrix multiplication operation, the selected bits from the slave latch may represent elements in a row (or a portion of a row) in a matrix, and the bits on the word lines may represent a column (or a portion of a column) in the matrix. During an operation in multiplier mode, the enabled bits of word lines 155 writes the corresponding bits of the second operand into their corresponding memory cells, while the disabled bits in word lines 155 each trigger a reset signal that causes zero values to be written into the corresponding memory cells. The results stored in fast memory array 153 constitute the product terms of the multiplication operation. An adder and a carry circuit in a compute circuit 106 (e.g., one of arithmetic and logic circuits 106-1. 106-2, . . . , 106-4) may provide a sum of the product terms to complete the multiplication operation. The result of the multiplication operation then may be written back from compute bus 154 back into fast memory array 153. Multiplier mode is particularly advantageous in an application where matrix multiplications are heavily used, such as many AI applications.

Figure 1E:
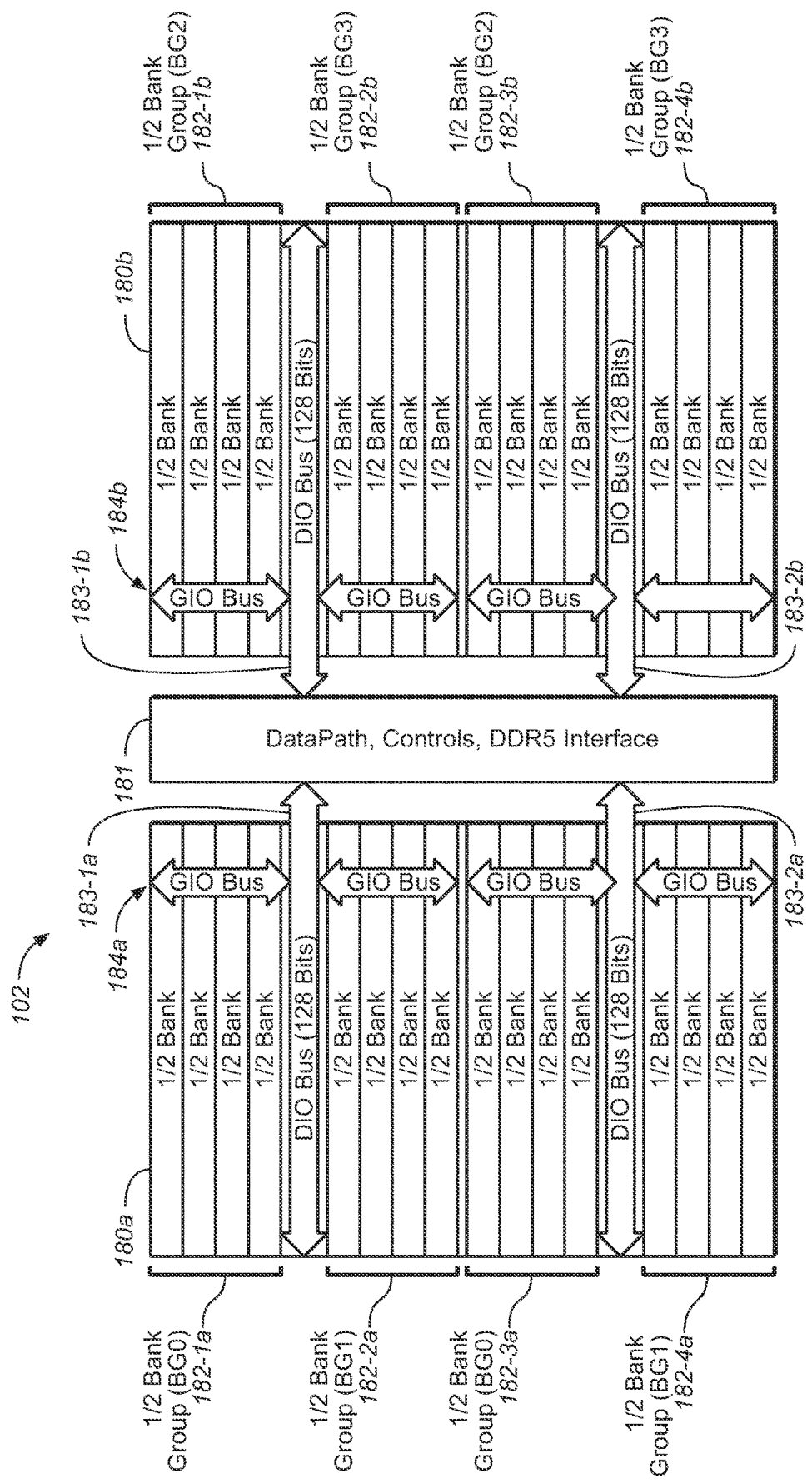
FIG. 1(e) shows a functional organization of memory bank groups BG(0)-BG(3) of the fast memory circuits in companion chip 101, according to one embodiment of present invention.

FIG. 1(e) shows a functional organization of memory bank groups BG(0)-BG(3) in companion chip 102, according to one embodiment of present invention. As shown in FIG. 1(e), memory banks 180 of fast memory circuits 107 on companion chip 102 may be organized into portions 180a and 180b, both portions sharing data path control and input and output interface circuits 181, representing control and data circuits 108 and input and output interface circuits 109 of each of FIGS. 1(a)-1(c). Portion 180a includes bank groups BG(0) and BG(1), while portion 180b includes bank groups BG(2) and BG(3), such that portions 180a and 180b, together, present four bank groups. In this embodiment, fast memory circuits 107 on companion chip 102 may service 64 Gbits of quasi-volatile memory cells on memory chip 101. Each bank group is divided into two half-bank groups, indicated in FIG. 1(e) as half-bank group 182-1a, 182-2a, 182-3a, 182-4a, 182-1b, 182-2b, 182-3b, 182-4b. Specifically, half-bank groups 182-1a and 182-3a form bank group BG[0], half-bank groups 182-2a and 182-4a form bank group BG[1], half-bank groups 182-1b and 182-3b form bank group BG[2], and half-bank groups 182-2b and 182-4b form bank group BG[3]. A general input/output bus, GIO bus 184 (indicated in FIG. 1(e) by GIO buses 184a and 184b), allows access from input and output interface circuits 109. In addition, for data transfer between bank groups, e.g., for computation using arithmetic and logic circuits 106, 256-bit internal data bus DIO 183 (represented in FIG. 1(e), respectively, by 128-bit half-buses 183-1a and 183-2a in portion 180a and 128-bit half-buses 183-1b and 183-2b in section 180b) is provided. In this embodiment, each half-bank group may include four 8-tile wide half-banks, with each half-bank having 4-8 Mbits of fast memory cells. In this embodiment, GIO bus 183 delivers one page of data (2 Kbytes) over input and output interface 109 to host processor 103 under each cycle of an industry standard bus protocol (e.g., DDR5).

Figure 1F:
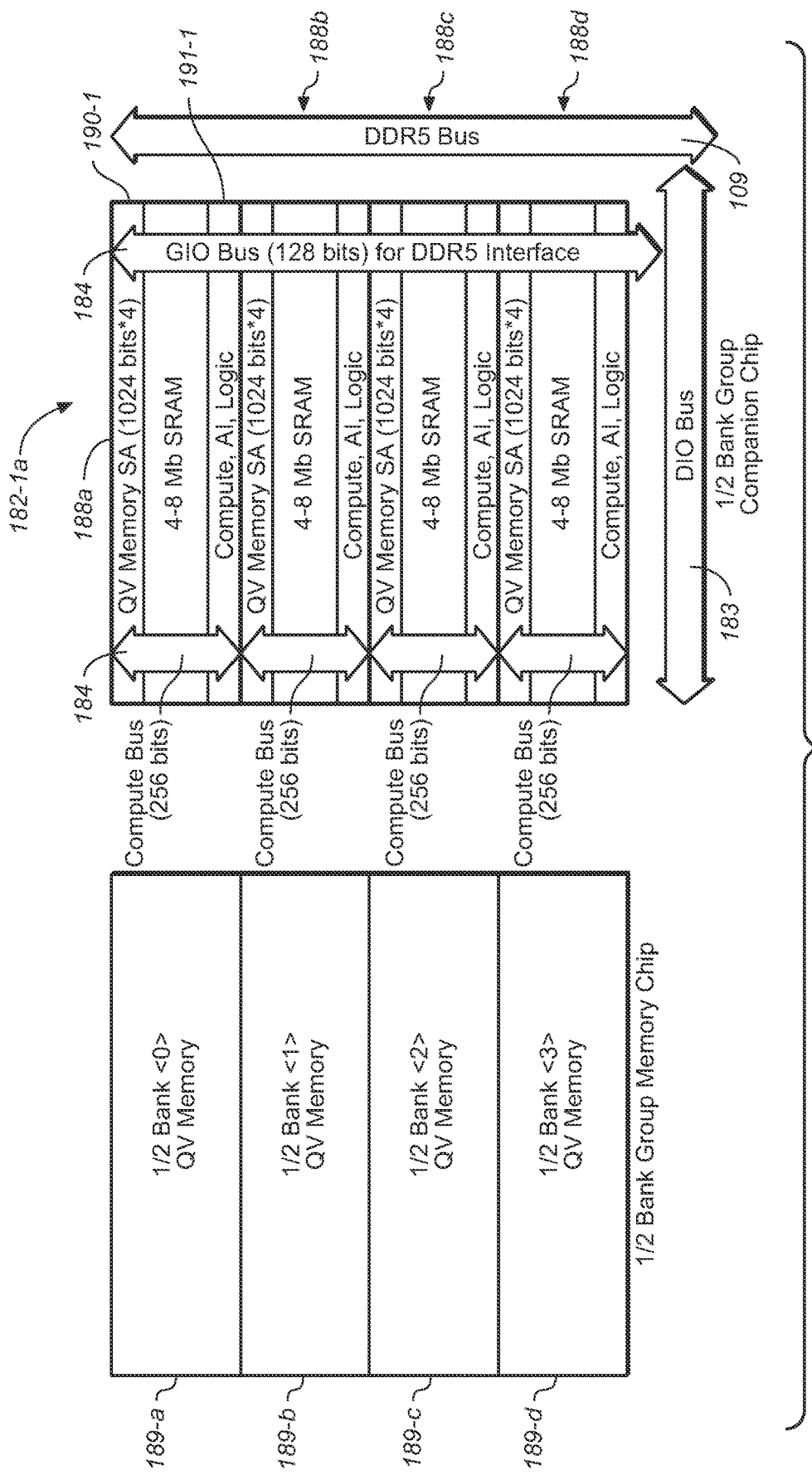
FIG. 1(f) illustrates four half-banks 188a-188d of a half-bank group (e.g., half-bank group 182-1a of FIG. 1(e)) on companion chip 102, relative corresponding half-banks 189a-189d of quasi-volatile memory circuits in memory chip 101, according to one embodiment of the present invention.

FIG. 1(f) illustrates four half-banks 188a-188d of a half-bank group (e.g., half-bank group 182-1a of FIG. 1(e)) on companion chip 102, relative corresponding half-banks 189a-189d of quasi-volatile memory circuits in memory chip 101, according to one embodiment of the present invention. As shown in FIG. 1(f), each of half-banks 188a-188d is bordered by a sense amplifier section (e.g., sense amplifier section 190-1), on one side, and by an arithmetic and logic circuit section (e.g., arithmetic and logic section 191-1) on the other side. Each sense amplifier services data retrieved over the hybrid bonds or micro-bumps from a corresponding half-bank of quasi-volatile memory cells (e.g., half-bank 189a) in memory chip 101. In one embodiment, sense amplifiers for 4096 bits of user data are provided in each half-bank. GIO bus 184, in addition to allowing host access from input and output interface circuit 109, also allows reading and writing between each half-bank of fast memory circuits of companion chip 102 and its corresponding half-bank of quasi-volatile memory circuits on memory chip 101. In this manner, the fast memory circuits may serve as a cache to the corresponding quasi-volatile memory circuit or, independently, be used for storing frequently accessed data ("hot data"; e.g., data that is more than ten times more frequent that data stored in the quasi-volatile memory circuits), or as a storage of configuration or control data ("metadata") for the corresponding quasi-volatile memory circuits. Such metadata improves performance and reliability of the quasi-volatile memory circuits.

Figure 1G:
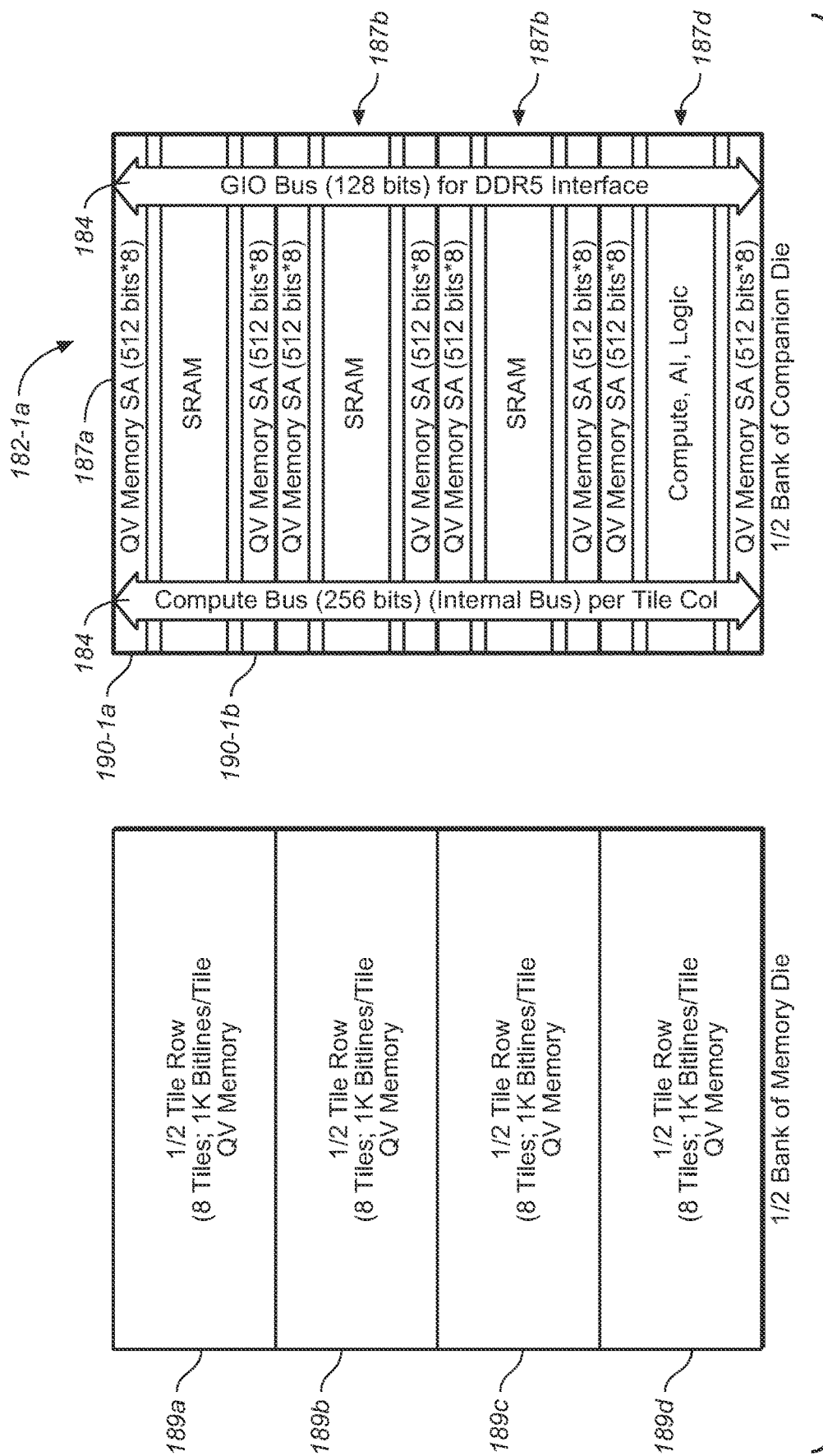
FIG. 1(g) illustrates four half-banks 187a-187d of a half-bank group (e.g., half-bank group 182-1a of FIG. 1(e)) on companion chip 102, relative corresponding half-banks 189a-189d of quasi-volatile memory circuits in memory chip 101, according to another embodiment of the present invention.

FIG. 1(g) illustrates four half-banks 187a-187d of a half-bank group (e.g., half-bank group 182-1a of FIG. 1(e)) on companion chip 102, relative corresponding half-banks 189a-189d of quasi-volatile memory circuits in memory chip 101, according to an alternative embodiment of the present invention. As shown in FIG. 1(g), unlike the embodiment of FIG. 1(f), the half-bank 187a-187d do not have identical configurations. The sense amplifiers in each of half-bank 187a-187d are provided as sense amplifier sections on both sides of each half-bank (e.g., sense amplifier sections 190-1a and 190-1b in half-bank 187a). Rather than providing arithmetic and logic circuits in each half-bank, arithmetic and logic circuits are concentrated in half-bank 187-d. Other than its configuration, this alternative embodiment operates in the same manner as that described above in conjunction with the embodiment of FIG. 1(f). For some applications, this alternative embodiment may provide comparable or better performance than the embodiment of FIG. 1(f). For other applications, the embodiment of FIG. 1(f) may provide better performance than the embodiment of FIG. 1(g).

As shown in FIGS. 1(e) and 1(f), each half bank within each half-bank group (e.g., half-bank 188a of half-bank group 182-1a) is provided access to a compute bus (indicated generally by compute bus 184), which is a bus shared between sense amplifier section, the fast memory circuits, and the arithmetic and logic circuits. In one embodiment, the compute data bus is 256-bits wide per tile column, with each half-bank group being eight tiles wide. (Of course, the widths of the compute data bus and the half-bank group may vary, depending on the requirements of the intended application.) Accordingly, a significant on-chip data bandwidth is provided within the half-bank group for data transfer between the sense amplifier section (which delivers the data read from the quasi-volatile memory circuits in the memory chip), the fast memory circuits and the arithmetic and logic circuits. In this manner, large amount of data may be streamed into the fast memory circuits as operands for arithmetic and logic operations with other operands that are other data or previous computational results that have already been stored in the fast memory circuits or in the quasi-volatile memory circuits. For example, in an AI application, data may be stored in quasi-volatile memory and output through the sense amplification section during a read operation. The data then can be used, together with the weights stored in the fast memory circuits, to perform matrix multiplication, for example, using the on-chip arithmetic and logic circuits and the compute bus. This is in stark contrast with the practice in the prior art, which requires transferring data into or out of DRAM to processors (e.g., CPUs or GPUs). Under the embodiments of the present invention, such computations may be carried out without data transfer into or out of memory or the companion chip to the CPU or GPU.

Compute bus 184 enables massively parallel computational operations ("in-memory computations") to be performed, without operand fetching and resulting storing operations involving a host interface bus. In this embodiment, as each bank group includes four banks, four sets of in-memory computations may be carried out in parallel in each bank group. Each tile column may be configured for the same or different in-memory computation from the other tile columns. The results of these in-memory computations may then be sent to the host over the input and output interface. The in-memory computations carried out simultaneously may be independent or may be parts of a coordinated computation (i.e., an in-memory computation for each bank may involve an entire page of data). These in-memory computations not only significantly improve power and performance, they make integrated circuit 120 particularly advantageous to many applications, such as many AI applications previously deemed intractable. For example, neural networks may be implemented using in-memory computations, using input data fetched from the quasi-volatile memory circuits together with the weights of the neurons and the intermediate results that are already stored or available in time from the fast memory circuits. As another example, recursive computations (e.g., those involved in recursive neural networks) may also be implemented by in-memory computations. With a quasi-volatile memory (e.g., 64 Gbits) on memory 101 and a large amount of on-chip fast memory circuits (e.g., 64 Gbits of SRAM) on companion chip 102, their combination (i.e., integrated circuit 120) enables both heretofore unachievable performance for existing applications and heretofore intractable computational applications.

Figure 1H:
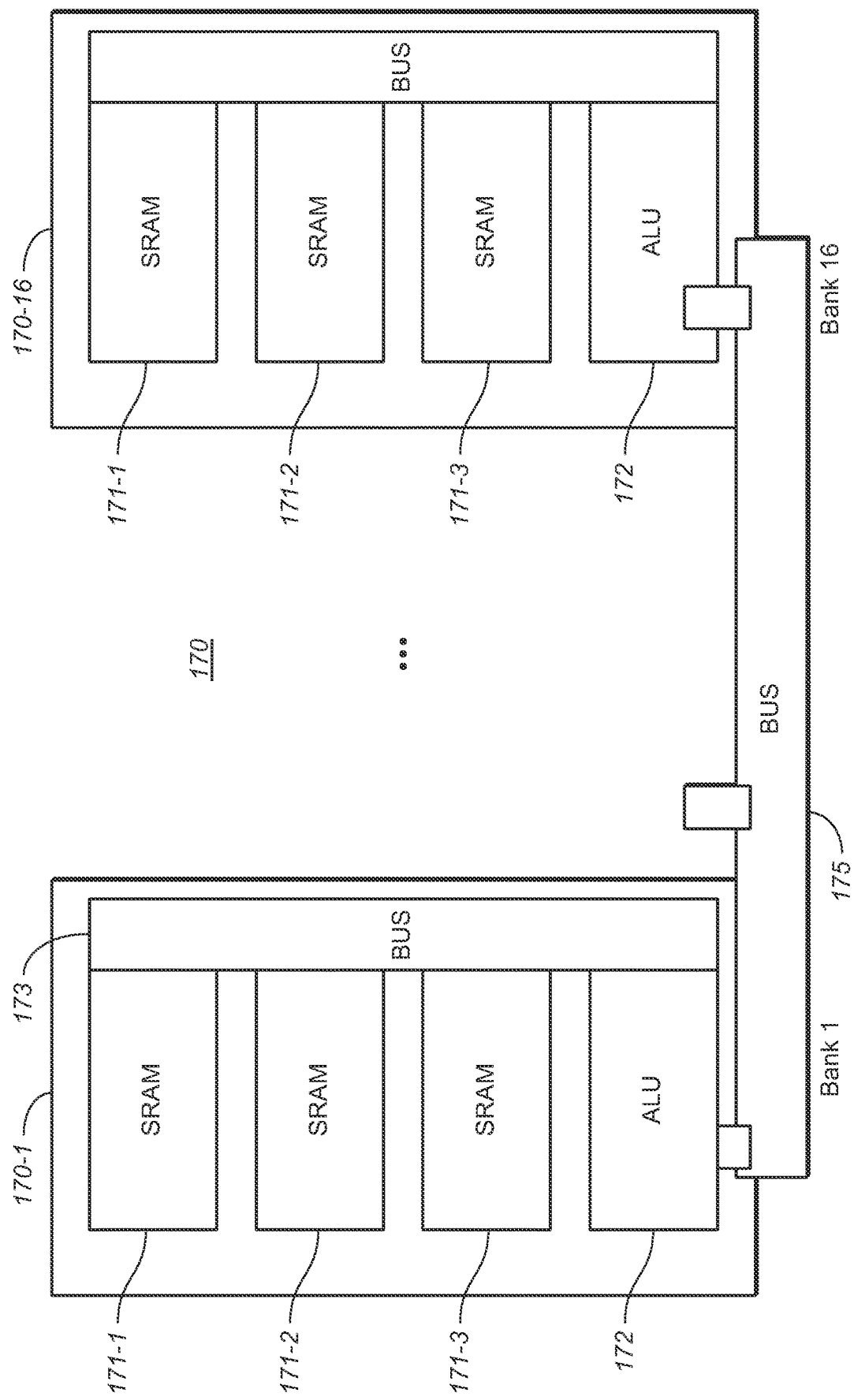
FIG. 1(h) illustrates functional configuration of a 16-bank computing platform 170 based on organization such as that described above in conjunction with FIG. 1(e), according to one embodiment of the present invention.
Figure 1I:
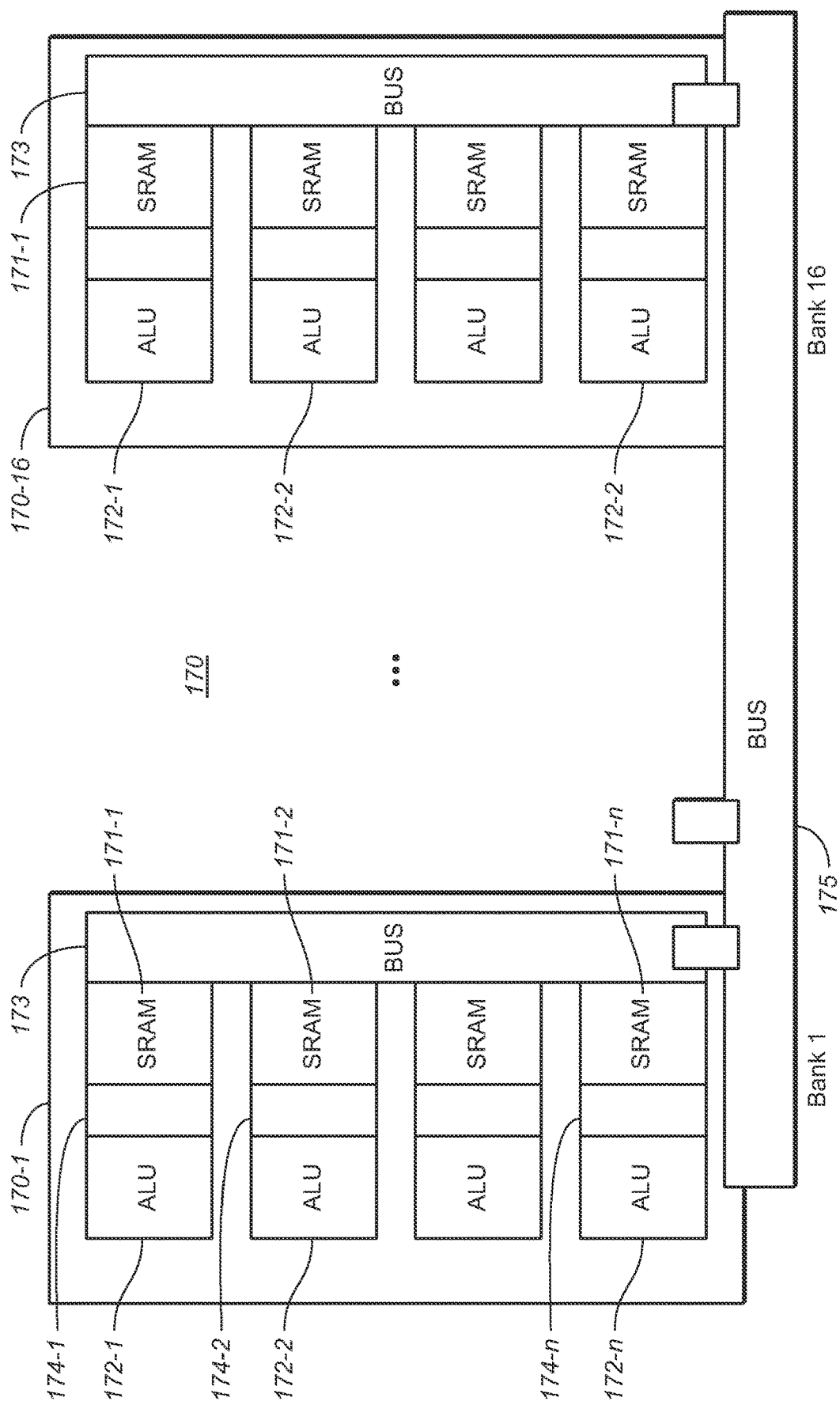
FIG. 1(i) illustrates an alternative organization of the 16-bank computing platform 170 of FIG. 1(e), in which modularized logic circuits 172 are distributed among modularized memory circuits 171, according to one embodiment of the present invention.

Companion chip 102 makes integrated circuit 120 essentially a computing platform with high density (e.g., greater than 64 GBytes) quasi-volatile or non-volatile memory available at a much greater bandwidth relative to conventional high-performance computing platforms that use DRAM modules (e.g., HBM modules) connected to a host processor over interposer connections. FIG. 1(h) illustrates functional configuration of a 16-bank computing platform 170, including computing banks 170-1, 170-2, . . . , 170-16, based on organization such as that described above in conjunction with FIG. 1(e), according to one embodiment of the present invention. As shown in FIG. 1(h), representative computing bank 170-1 includes representative modularized memory circuits 171-1, 171-2 and 171-3 (e.g., SRAM circuits) that constitute a memory bank, such as any of the memory banks in FIG. 1(e), discussed above. In addition, computing bank 170-1 also includes representative modularized logic circuits 172, connected to modularized memory circuits 171-1, 171-2 and 171-3 over local compute bus 173 (e.g., compute bus 154, described above). (The number of modularized memory circuits in each bank in FIG. 1(h) is provided merely for illustrative purpose; any suitable number of modularized memory or logic circuits are possible.) Local bus 173 in each of computing banks 170-1 to 170-16 has access to an intra-bank data bus (e.g., GIO bus 184 or DIO bus 183, described above) to allow data transfer between computing banks. In this configuration, modularized logic circuits 172 may form any suitable computing circuit, such as an ALU core, a GPU core, or any suitable embedded controller or microprocessor. Modularized logic circuits 172 may be implemented, for example, by FPGAs. In the configuration of FIG. 1(h), computing bank 170-1 may form a CPU with a 16-Mbyte SRAM cache that supports a 16-GB memory provided by the quasi-volatile or non-volatile memory of memory chip 101. One advantage of computing banks 170 arises from having modularized logic circuits 172 (e.g., the ALU or GPU core) in close proximity with fast memory circuits 171-1, 171-2 and 171-3, facilitated by local compute bus 173. In fact, an even greater advantage may be achieved by distributing the modularized logic circuits among the modularized fast memory circuits, such as illustrated by FIG. 1(i), so as to provide greater proximity between the modularized memory circuits and modularized the logic circuits. Data transfers between computing banks may be carried out in interbank data bus 175.

As shown in FIG. 1(i), each of computing banks 170-1, . . . , 170-16 includes modularized fast memory circuits 171-1, 171-2, . . . , 171-n and modularized logic circuits 172-1, 172-2, . . . , 172-n. In addition to intra-bank local compute bus 173, modularized data buses 174-1, 174-2, . . . , 174-n may be provided, each allowing data transfer between a modularized memory circuit and a modularized logic circuit adjacent to it. Thus, each modularized logic circuit may connect to a processor core in proximity.

The 16-bank computing platform may be configured to operate in a pipelined manner. For example, a deep neural network may include many layers. In one embodiment, one may use one computing bank for each layer of such a deep neural network. The weight matrix for the neurons in that layer of neural network may be stored in the fast memory circuits of the computing bank. When computation of a layer of the neural network is complete, its results are forwarded over to the next computing bank. The forwarding of data from one computing bank to another may be carried out in a synchronous manner, i.e., at a specified edge of a clock signal. This way, after an initial latency of 16 cycles, results for deep neural network may emerge every cycle thereafter. For this kind of computation, a conventional processor is limited by the total amount of data that can be placed in the fast memory circuits (e.g., SRAM) and then must go off-chip to fetch new data from DRAMs.

Figure 1J:
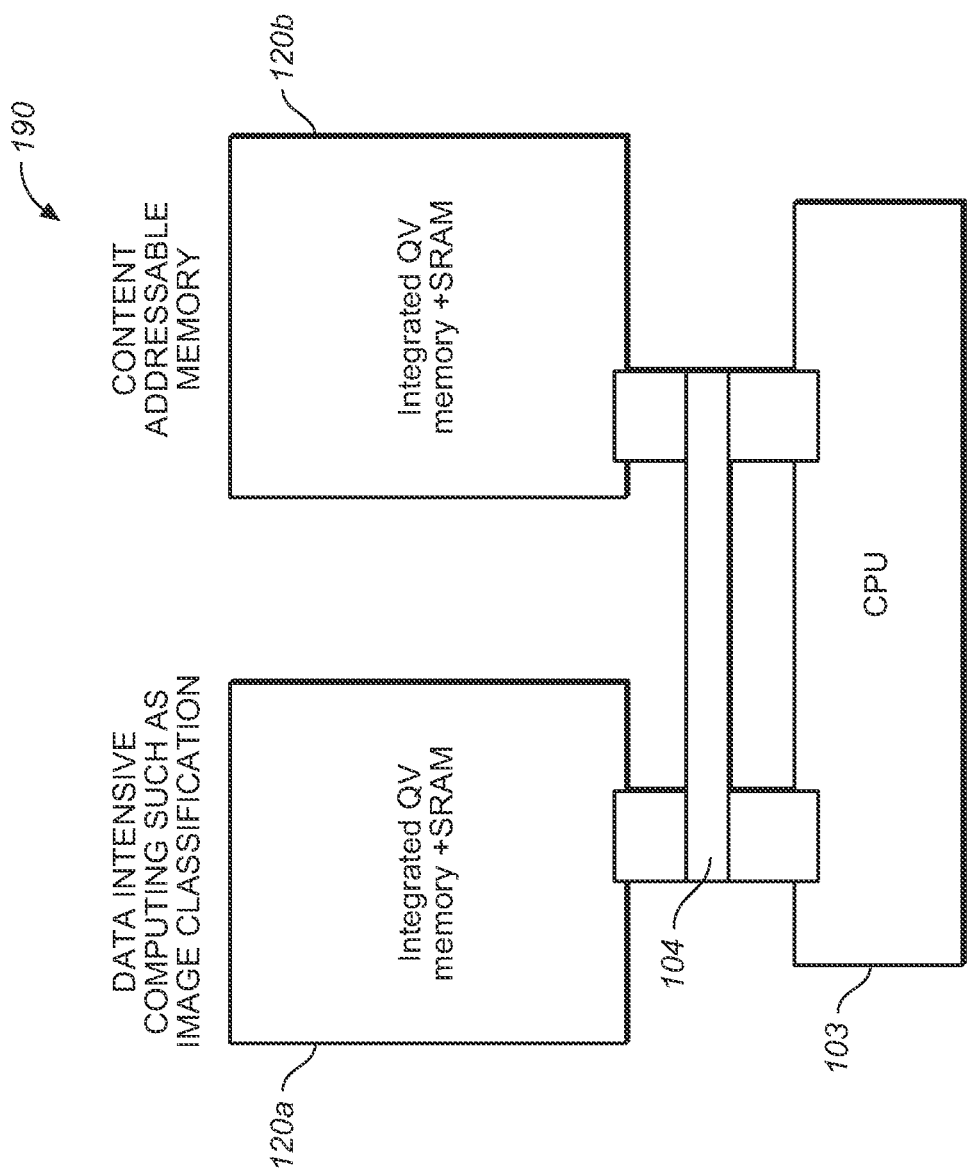
FIG. 1(j) shows circuit 190 in which integrated circuits 120a and 120b implement data-intensive in-memory computations and massive, parallel searches in CAMs, respectively, according to one embodiment of the present invention.

Non-provisional Application IV discloses logical functions that can be implemented using NOR memory strings, such as a content-addressable memory (CAM). A CAM allows parallel search of data. Because of the high-density achievable in memory chip 101, a CAM may be implemented on integrated circuit 120 to enable massive, parallel search data, as disclosed in Non-provisional Application IV. FIG. 1(j) shows circuit 190 in which integrated circuits 120a and 120b—both copies of integrated circuit 120, described above—implement data-intensive in-memory computations and massive, parallel searches in CAMs, respectively. Integrated circuits 120a and 120b are both controlled by host processor 103 over memory interface 104. For example, integrated circuit 120a may be tasked with highly data-intensive computations, such as image classification. The results of the data-intensive computations may be transferred, under control of host processor 103 over memory interface bus 104 to integrated 120b, where a massively parallel search may be carried out of an image database stored in CAM circuits in memory chip 101. For the reasons already stated above and in Non-provisional Application IV, both these operations, individually and in combination, are expected to deliver very fast execution. One also can envision using many copies of integrated circuits 120, with some programmed for logic functions and the rest implementing CAMs. In that configuration, the logic function integrated circuits may be programmed to perform various computation tasks in in parallel, or in one or more pipelines, with their results provided over one or more high-bandwidth memory interface buses for parallel searches.

Figure 2A:
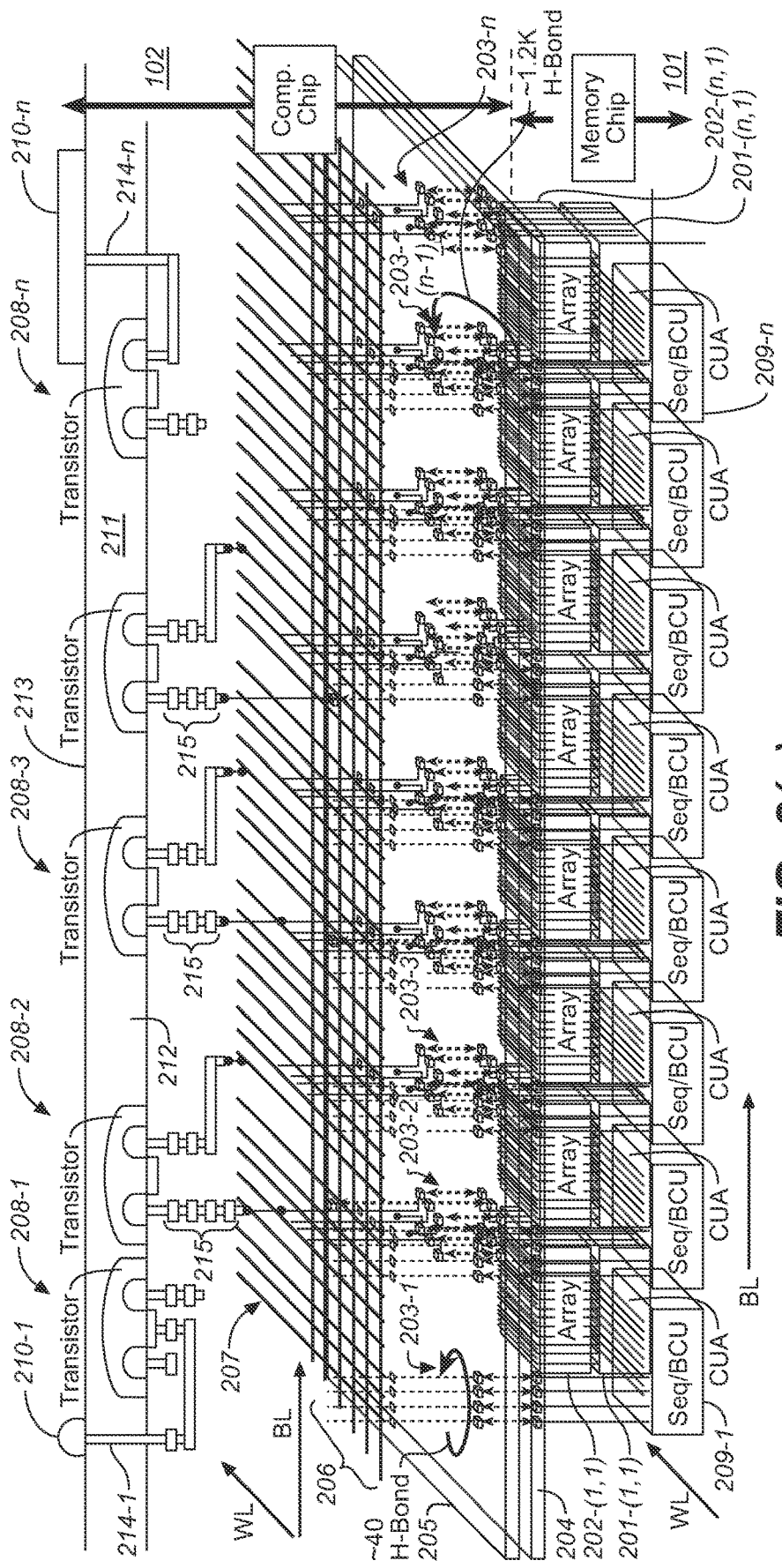
FIG. 2(a) illustrates generally hybrid bonded memory chip 101 and companion chip 102 of integrated circuit 120, according to one embodiment of the present invention; in this embodiment, memory chip and companion chip 102 are bonded in a "flip-chip" orientation.

FIG. 2(a) illustrates generally "flip-chip" or "face-to-face" bonded memory chip 101 and companion chip 102 of integrated circuit 120. In the embodiment of FIG. 2(a), companion chip 102—rather than memory chip 101—implements sense amplifiers (represented in FIG. 2(a) as some of circuit elements 208-1 to 208-n) that support the operations of the quasi-volatile or non-volatile memory arrays 202 of memory chip 101. Companion chip 101 also implements bit line control logic circuits at or near surface 212 of substrate 211 (represented in FIG. 2(a) by some of circuit elements 208-1, . . . , 208-n). Companion chip 102 also may route external high voltage signals (not shown) from the CuA of memory chip 101, supplying arrays 202 of quasi-volatile or non-volatile storage cells in memory chip 101. For example, high-voltage bit line-select (BLSEL) transistors are provided in the CuA of memory chip 101, each multiplexing multiple bit line signals of quasi-volatile memory array 202 onto a bit line-internal (BLI) node, which is then routed over a hybrid bond as an input signal to a corresponding sense amplifier on companion chip 102. In companion chip 102, the BLI node is connected by a conductor-filled via (represented by via 215 in FIG. 2(a)) to an input terminal of a sense amplifier, represented in FIG. 2(a) respectively by via 217 and circuit element 208-2.

The sense amplifiers and their associated data latches, which are formed by high-performance, low-voltage transistors on companion chip 102 using an advanced manufacturing process node that is optimized to CMOS logic technology, and are not exposed to the thermal cycles in the formation of the quasi-volatile memory arrays of memory chip 101, would suffer no performance degradation due to the thermal cycles. As the additional capacitance of the BLI node is very small (e.g., less than 2%), such a capacitance has no substantial impact on either the sense amplifier performance or operation. Under this arrangement, the CuA on memory chip 101 implements high-voltage word line and bit line decoders, drivers and multiplexers. As a result, the "division of labor" between memory chip 101 and companion chip 102 not only reduces the area requirement on the CuA of memory chip 101, the multiplexing of signals through the BLI nodes greatly reduces the number of hybrid bonds required to route bit line signals to companion chip 102. This is in stark contrast to, for example, the use of hybrid bonds for routing bit line signals, as taught by Lu, discussed above. In this embodiment, rather than 20,000 hybrid bonds per tile required without multiplexing (as taught in Lu), about ~1K hybrid bonds are required in each tile to route the bit line signals to companion chip 102, while enjoying the advantage of high signal integrity that results from not exposing the high-performance, low voltage circuits (e.g., the sense amplifiers) in the thermal cycles in the manufacturing process of the quasi-volatile memory arrays. The significant reduction in the number of hybrid bonds needed to route signals to companion chip 102 substantially releases a significant number of routing channels in the metal interconnect layers of companion chip 102. Not implementing the high-performance, low-voltage logic circuits in memory chip 101 also reduces the number of masking steps required in the fabrication of memory chip 101, resulting in a simpler manufacturing process (i.e., higher yield) and lower wafer processing cost in producing memory chip 101.

Having sense amplifiers for memory array 202 of memory chip 101 and high-performance, low-voltage fast memory circuits 107 and logic circuits 106 all in close proximity with each other on the companion chip 102 provides the advantages of: (i) allowing these circuits to be manufactured under a process optimized for their performance, (ii) avoiding power-hungry and time-consuming computational operations that bring data from memory chip 101 to companion chip 102 and back to memory chip 101 again, (iii) providing greater noise immunity from high-voltage circuitry, which still resides on memory chip 101, thereby resulting in greater sensing sensitivity; (iv) leveraging the fast memory circuits and the sense amplifiers in the companion chip to carry out write operations (i.e., both programming and erase) in parallel in the quasi-volatile memory circuits (i.e., servicing read operations from the fast memory circuits, while a write operation involving data on the same page is carried out in parallel in the quasi-volatile memory circuits); and (v) leveraging the fast memory circuits and the sense amplifiers to monitor the health of quasi-volatile memory circuits, so as to improve reliability and endurance of the quasi-volatile memory circuits.

In one embodiment, memory chip 101 has a 64-Gbit storage capacity in the three-dimensional quasi-volatile memory arrays, segmented into 1,024 tiles, each tile having 64 Mbit of random access quasi-volatile memory cells, with its supporting circuits in the CuA (except for the sense amplifiers). Read latency to a location in the quasi-volatile memory array is approximately 100 nanoseconds, with an endurance of approximately $10^{10}$ programming and erase cycles. In that embodiment, each tile in memory chip 101 is separately connected by hybrid-bonded to a corresponding one of 1024 SRAM modules on companion chip 102. On companion chip 102, each tile has (i) 64 Kbits of SRAM cells and (ii) the sense amplifiers for supporting the quasi-volatile memory cells in the corresponding tile of memory chip 101. Read latency to a location in the SRAM cells of the tile is approximately 25 nanoseconds, with an essentially unlimited endurance. Having the SRAM modules on companion chip 102 serve as a fast cache memory, uniquely mapped to quasi-volatile memory arrays in corresponding designated tiles, results in a heterogenous memory circuit that can deliver the best advantages of both memory types, i.e., (i) the significantly higher density of the quasi-volatile memory cells and (ii) the significantly faster read access times and the significantly higher endurance in the SRAM circuits. Thus, where relying solely on SRAM circuits may be too costly for applications operating on large data sets, or where relying solely on quasi-volatile memory circuits may be too slow or have an endurance that is inadequate to support high-frequency, read-intensive or write-intensive applications, the heterogeneous memory circuit that combines the memory types can provide a superior solution. The present invention includes circuitry and methods for allocating data between the fast memory circuits (e.g. SRAM) and the slower memory circuits (e.g. quasi-volatile memory) and moving data between one type of memory circuits and the other type of memory circuits without host involvement.

Figure 2B:
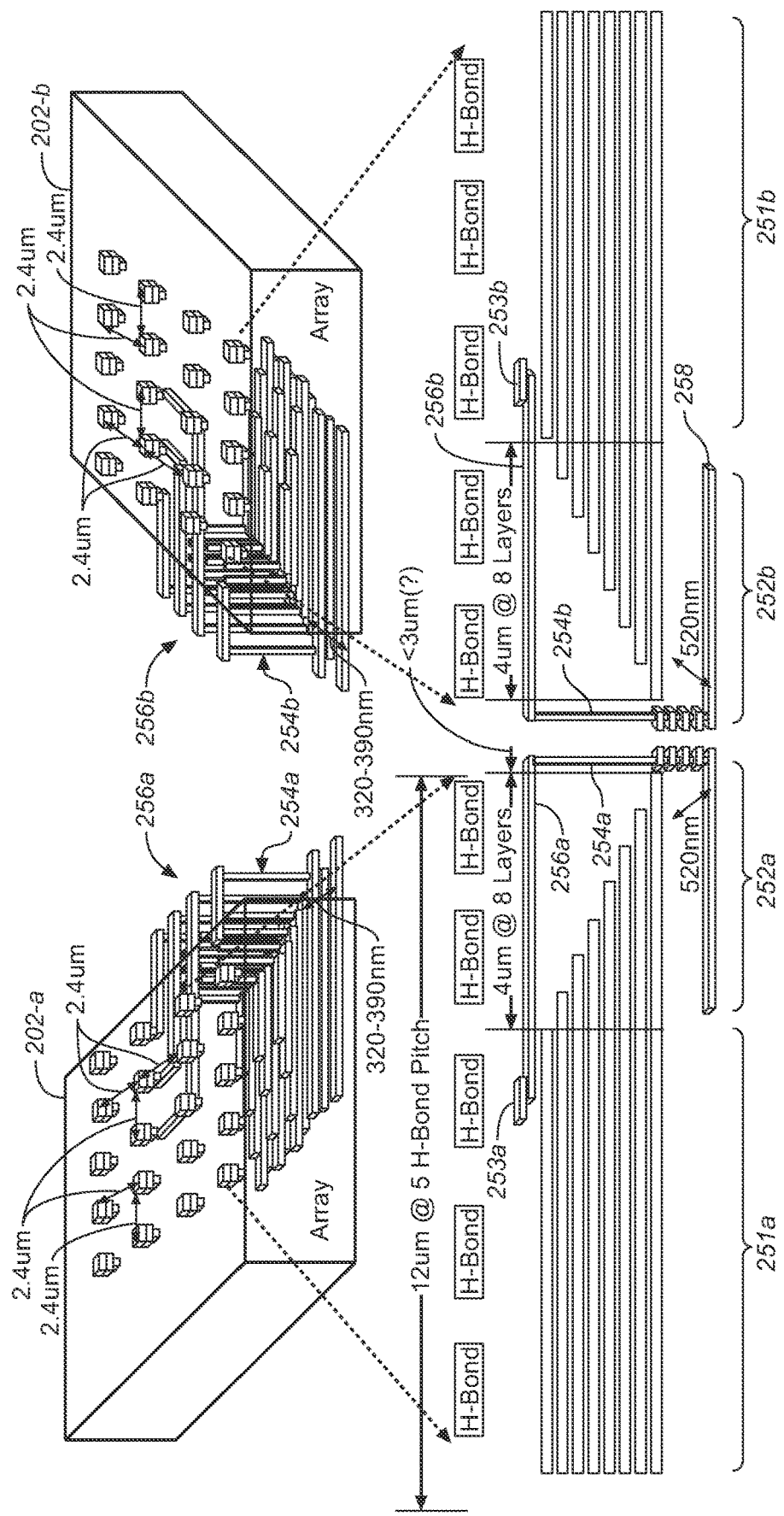
FIG. 2(b) illustrates in greater detail array structures 202-a and 202b, which are representative of any two adjacent array structures in array structures 202-(1,1) to 202-(n, m).

As shown in FIG. 2(a), memory chip 101 includes an n by m formation of tiles, each tile having a CuA structure and an associated array structure. Thus, FIG. 2(a) shows CuA structures 201-(1,1) to 201-(n,m) and array structures 202-(1,1) to 202-(n,m). Each CuA structure may include, for example, various voltage sources and various high-voltage and medium-voltage analog and logic circuits to support its corresponding tile. On the side of this formation of tiles are provided sequence and control modules 209-1 to 209-n, each including sequencers (Seq) and bit line and word line control circuits for memory banks (BCU). As discussed above, each array structure consists of a 3-dimensional array of storage cells, organized as quasi-volatile or non-volatile NOR memory strings, and a staircase structure, which allows electrical access to the common drain region or bit line of each NOR memory string. FIG. 2(b) illustrates in greater detail array structures 202-a and 202b, which are representative of any two adjacent array structures in array structures 202-(1,1) to 202-(n,m). As shown in FIG. 2(b), array structure 202-a and 202b each include an array of storage cells (exemplified by arrays 251a and 251b, respectively) and, on its opposite sides, staircases (exemplified by staircases 252a and 252b). FIG. 2(b) also shows signals from the CuA of memory chip 101 being routed through conductor-filled vias 254a and 254b to hybrid bonds 253a and 253b over interconnect conductor layer 256, with sections 256a and 256b overlapping, staircases 2512 and 252b, respectively.

Memory chip 101 and companion chip 102 are bonded by stripes 203-1 to 203-n of hybrid bonds, each stripe running along the word-line (WL) direction, with each stripe of hybrid bonds provided above the space between the storage cell arrays of adjacent array structures, overlapping their respective staircases. These hybrid bonds connect signals traveling "vertically" (i.e., substantially perpendicular to the surfaces of the semiconductor substrates) through conductor-filled vias. In one embodiment, where desirable, signals connected by hybrid bonds between the memory chip and the companion chip are multiplexed and demultiplexed to share and increase the effective number of interconnections by hybrid bonds and to overcome the density limitations of current hybrid bond technology. FIG. 2(a) also shows metal layers 204-207 in companion chip 102. Metal layer 204 provides an interconnection layer that is used to distribute signals to destinations in both memory chip 101 and companion chip 102, including high voltage signals originating from CuA in memory chip 101. Metal layer 205 provides a substantial ground plane that shields other circuits in companion chip 102 from interference by these high voltage signals. Metal layer 206 provides parallel interconnect conductors ("feed-thru conductors") each extending along the bit-line (BL) direction to allow bit lines signals to be routed to a second interconnection network 207, which has interconnection conductors running along the WL direction.

More specifically, hybrid bonds 203-1 to 203-n connect bit lines from array structures 202-(1,1) to 202-(n,m) in memory chip 101 to sense amplifiers at surface 212 of substrate 211 in companion chip 102 and between the circuitries in the CuA of memory chip 101 and the circuitry at surface of substrate 211 in companion chip 102. Hybrid bonds 203-1 to 203-n also routes the high voltage signals from the voltage sources at surface 212 of the semiconductor substrate in memory chip 101 to other portions of memory chip 101 through metal layer 204 in companion chip 102. Substrate 211 may be a semiconductor wafer that is thinned after formation of the circuitry of companion chip 102 to an insulator layer, e.g., silicon oxide layer. Alternatively, substrate 211 may be formed by implanting oxygen atoms into the semiconductor wafer to form an oxide layer, after annealing. After formation of the circuitry of companion chip 102 at surface 212, substrate 211 may be separated from the semiconductor wafer mechanically. Substrate 211 is referred to as a silicon-on-insulator (SOI) substrate. Bonding pads 210-1 to 210-n may then be formed on the cleaved surface 213.

FIG. 2(a) also shows bonding pads 210-1 to 210-n on surface 213 of substrate 211, opposite to surface 212, where circuit elements 208-1 to 208-n are formed. Bonding pads 210-1 and 210-n are each provided to allow access to signals from the circuitry formed at surface 212 of substrate 211 through TSVs, such as those shown in FIG. 2(a) as TSVs 214-1 to 214-n. Bonding pads 210-1 to 210-n may allow wafer-level or chip-level bonding to another substrate. Suitable bonding techniques may be hybrid bonding, direct interconnect or micro-bump bonding. In FIG. 2(a), for illustrative purpose, bonding pad 210-n is represented by a bonding pad suitable for hybrid bonding. Bonding pad 210-1 is represented by a micro-bump suitable for micro-bump bonding.

Figure 2C:
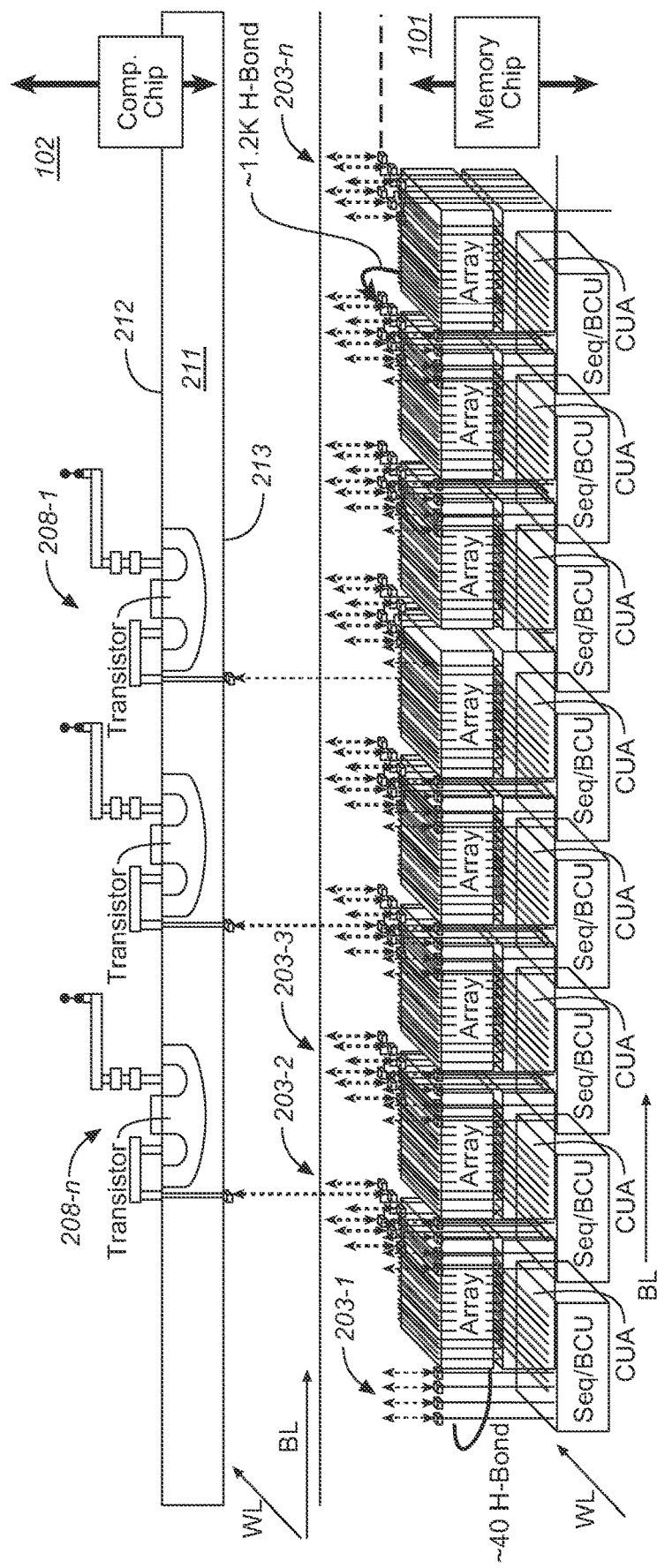
FIG. 2(c) illustrates generally hybrid bonded memory chip 101 and companion chip 102 of integrated circuit 120, according to another embodiment of the present invention; in this embodiment, memory chip and companion chip 102 are bonded in a "stacked" orientation.

FIG. 2(c) illustrates generally hybrid bonded memory chip 101 and companion chip 102 of integrated circuit 120, according to another embodiment of the present invention; in this embodiment, memory chip 101 and companion chip 102 are bonded in a "stacked" orientation. As shown in FIG. 2(c), memory chip 101 and companion chip 102 each contain substantially the same circuitry as described above in conjunction with FIG. 2(a). except that bonding pads for hybrid bonding (or micro-bumps for micro-bump bonding, as the case may be) are formed on the "backside" of substrate 211. This is achieved, for example, by having companion chip 102 fabricated on an SOI substrate, which is thinned down sufficiently (e.g., down to 3 microns or thinner). Connectors (e.g., bonding pads or micro-bumps) are then formed on surface 213 of substrate 211 to mate by hybrid bonding (or micro-bump bonding) with corresponding connectors on memory chip 101. Connectors on surface 213 of substrate 211 are connected to circuitry at surface 212 by miniaturized high-density TSVs through conductor-filled vias through substrate 211. Relative to the "flip-chip" embodiment shown in FIG. 2(a), this embodiment has the advantage that the complexity of signal routings in metal layer 204, 205, 206, and 207 (e.g., "feed-thru" routing in metal layers 206 and 207) may be significantly simplified, or substantially avoided.

Figure 2D:
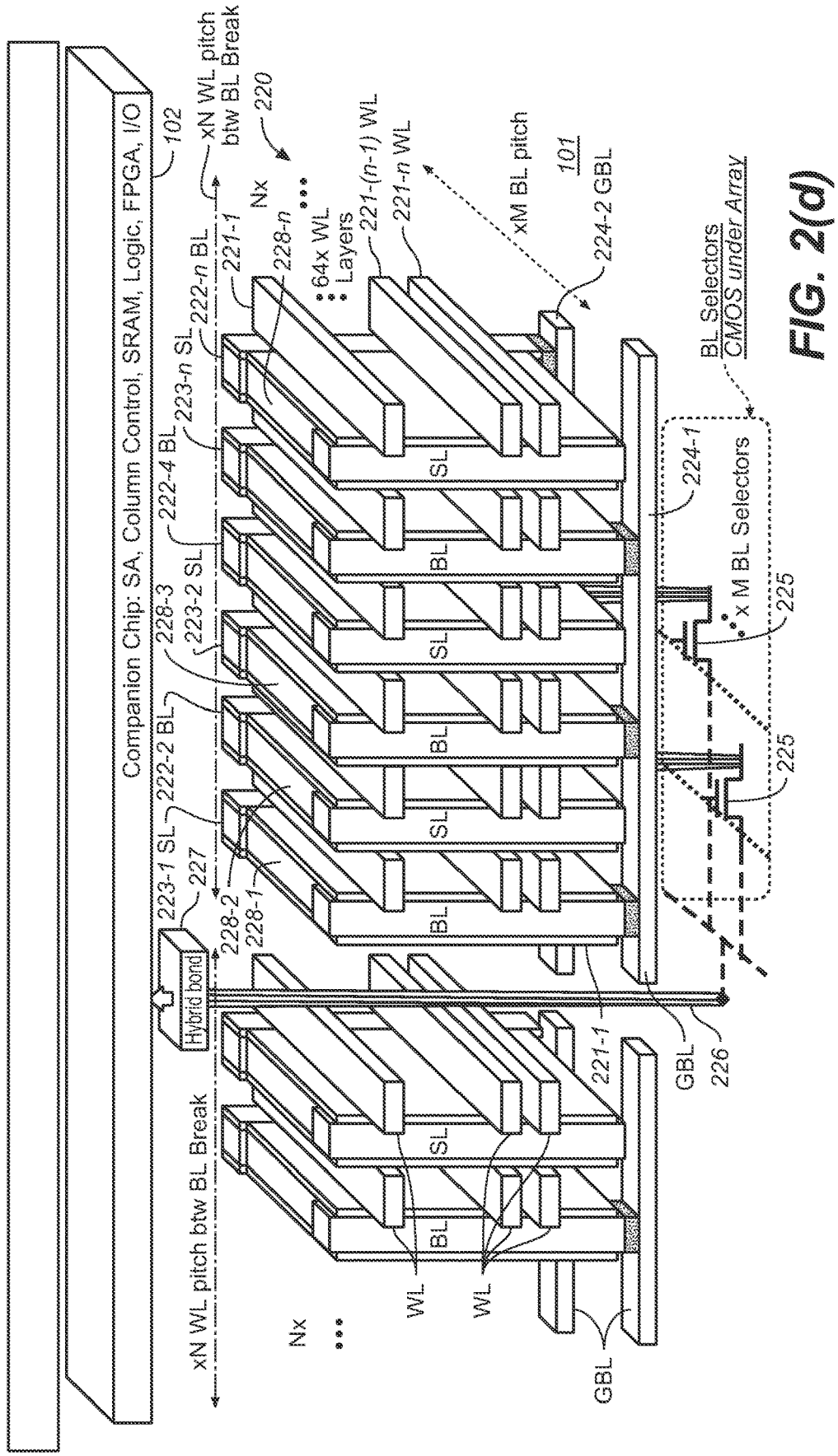
FIG. 2(d) illustrates generally hybrid bonded memory chip 101 and companion chip 102 of integrated circuit 120, according to a third embodiment of the present invention; in this third embodiment, memory chip 101 includes VNOR memory arrays.

In FIGS. 2(a) and 2(c), memory chip 101 implements HNOR memory string arrays. The present invention also may be practiced with memory 101 implementing quasi-volatile or non-volatile VNOR memory strings arrays. Various embodiments of VNOR memory string arrays are described, for example, in Non-provisional Application III. FIG. 2(d) illustrates generally hybrid bonded memory chip 101 and companion chip 102 of integrated circuit 120, according to a third embodiment of the present invention; in this third embodiment, memory chip 101 includes VNOR memory string arrays. As shown in FIG. 2(d) row 220 in a tile of one or more quasi-volatile or non-volatile VNOR memory string arrays includes memory string-pairs 228-1, 228-2, . . . , and 228-n, with two VNOR memory strings formed on opposite sides of each memory string-pair.

As shown in FIG. 2(d), the VNOR memory strings in each memory string-pair share a common source line and a common bit line, indicated in FIG. 2(d) by bit lines (BLs) 222-1. 222-2, . . . , and 222-n and source lines (SLs) 223-1, 223-2, . . . , and 223-n, respectively. On both sides of each of memory string-pairs 228-1, 228-2, . . . , and 228-n between the common bit line and the common source line are formed two channel regions each isolated from a stack of word line conductors by a charge-trapping layer. In FIG. 2(d), one stack of word line conductors is represented by word line conductors 221-1, 221.20, . . . , and 221-m. Across row 220, the common source lines and the common bit lines of the memory string-pairs alternate between the front and the back portions of row 220. A pair of conductors ("global bit lines") 224-1 and 224-2 connect the common bit lines of row 220 at the front and the back of memory string-pairs 228-1, 228-2, . . . , and 228-n. In this embodiment, the common source lines 223-1, 223-2, . . . , 223-n are each pre-charged by voltage applied to the associated one of common bit lines 222-1, . . . , 222-n, or by hardwire connections (not shown) to voltage sources in the CuA of memory chip 101, as described in Non-provisional Application III.

Bit line selector circuits 225 each connected to global bit lines of multiple rows of VNOR memory strings in the tile are provided in the CuA underneath VNOR memory string array to select a signal from one of the global bit lines 224-1 and 224-2 in the tile. Bit line selection circuits 225 perform substantially the same function as the multiplexers that select from bit line signals to provide selected bit line signal BLI described above in conjunction with FIG. 2(a). In this embodiment of FIG. 2(d), the selected signal is provided to bit line signal BLI represented by conductor-filled via 226, which is connected to one of bonding pads (or micro-bumps) 227 at the bonding surface of memory chip 101. Bonding pads (or micro-bumps) 227 connect with corresponding bonding pads (or micro-bumps) in companion chip 102 by hybrid bonding (or micro-bump bonding) in substantially the same manner as described above in conjunction with FIG. 2(a).

Figure 2E:
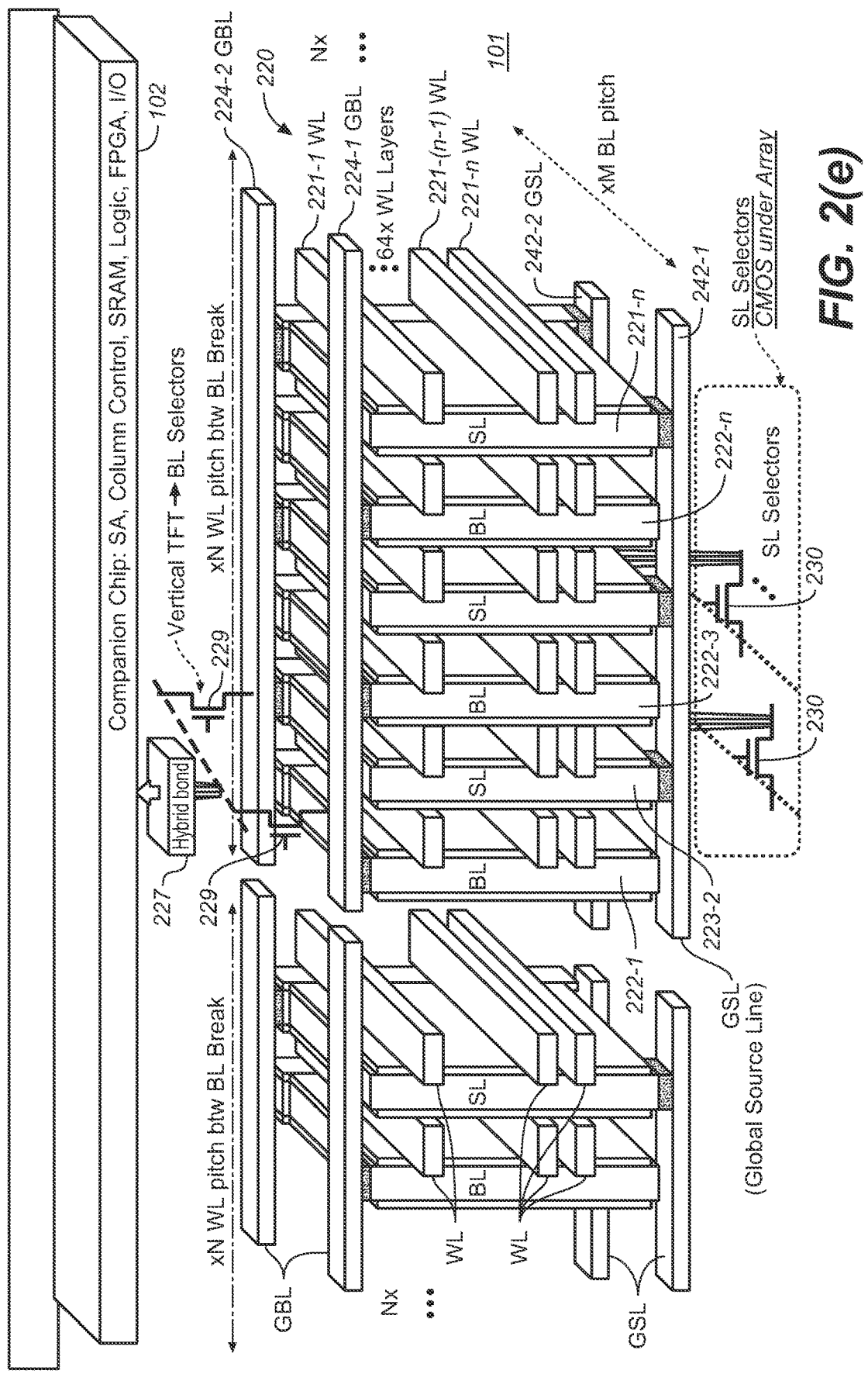
FIG. 2(e) illustrates generally hybrid bonded memory chip 101 and companion chip 102 of integrated circuit 120, according to a fourth embodiment of the present invention; in this fourth embodiment, memory chip 101 includes VNOR memory arrays and vertical thin-film transistors (TFT).

FIG. 2(e) illustrates generally hybrid bonded memory chip 101 and companion chip 102 of integrated circuit 120, according to a fourth embodiment of the present invention; in this fourth embodiment, memory chip 101 includes VNOR memory string arrays and vertical thin-film transistor (TFT) that serve as an additional layer of bit line selection circuits. In FIG. 2(e), an additional conductor layer of global bit lines, represented by global bit lines 224-1 and 224-2 are provided in a metal layer ("global bit line layer 224") above the VNOR memory string array. In this embodiment, these additional global bit lines are not connected to bonding pads 227 by the bit line selector circuits in the CuA of memory chip, but by vertical TFTs, represented in FIG. 2(e) by vertical TFTs 229 formed above global bit line layer 224. Vertical TFTs being used for bit line selection are described in the Provisional application. Having source line selection circuits 230 and bit line selection circuits in vertical TFTs 229 allow greater flexibility in routing bit line signals through the BLI nodes to sense amplifiers in companion chip 102. As the number of hybrid bonds required for this routing may be reduced, the footprints for memory chip 101 and companion chip 102 may be reduced, thereby resulting in the advantages of a denser circuit. The vertical TFTs also may be used in HNOR memory string arrays to efficiently select and route bit lines to companion chip 102.

Figure 3:
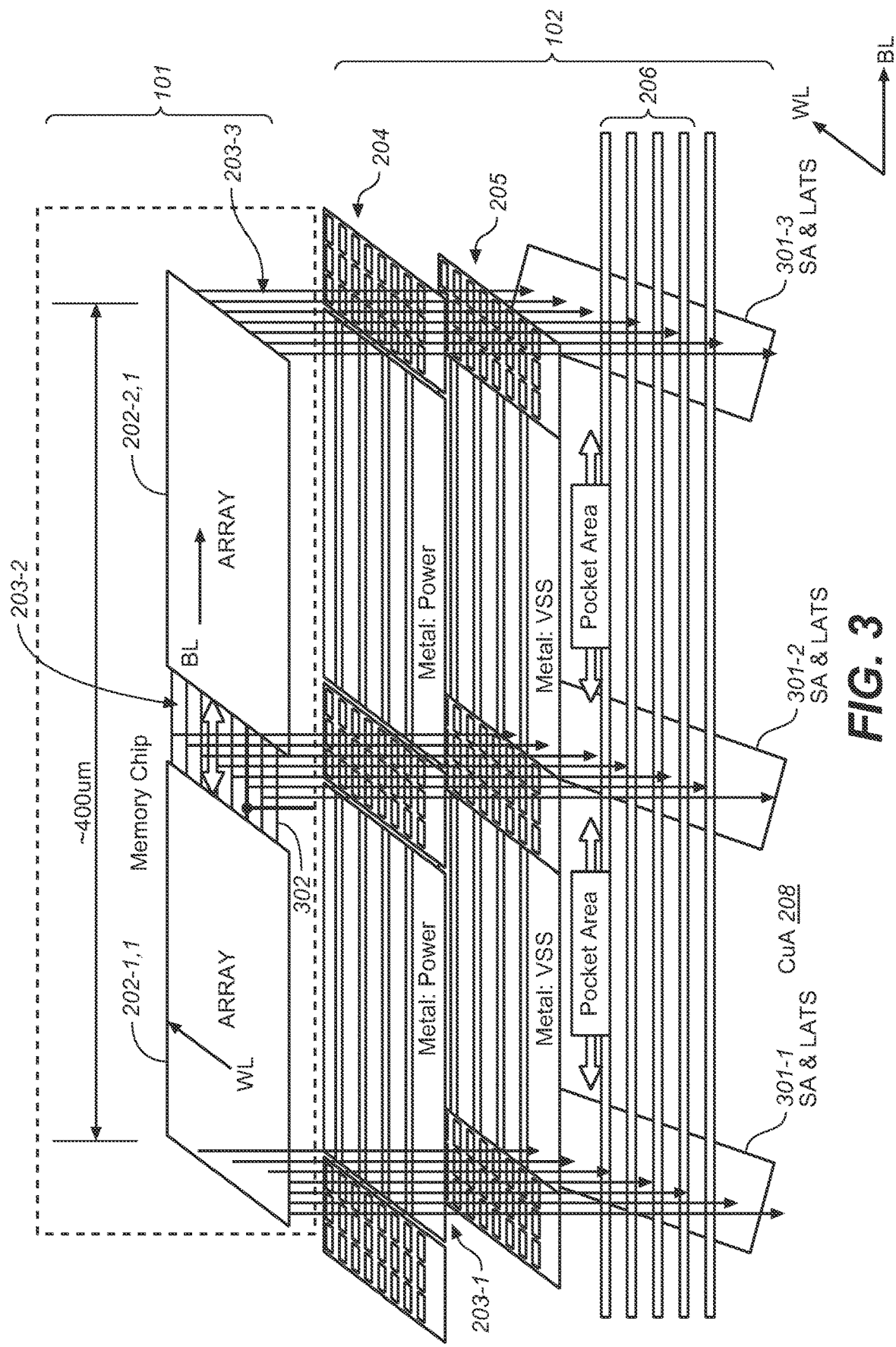
FIG. 3 shows a portion of integrated circuit 120 of FIG. 2(a) in greater detail.

FIG. 3 shows a portion of integrated circuit 120 of FIG. 2(a) in greater detail. As shown in FIG. 3, stripes 203-1, 203-2 and 203-3 of hybrid bonds are provided adjacent to array structures 202-(1,1) and 202-(2,1), which are representative of any two adjacent array structures 202-(1,1) to 202-(n,m) of FIG. 2(a). Some of the signals connected by stripes 203-1, 203-2 and 203-3 of hybrid bonds are routed by conductor-filled vias to the circuitry at surface 212 of substrate 211 vertically through openings in metal layers 204-207 of companion chip 102. Other signals are fanned out by feed-thru metal layer 206. As discussed above, metal layer 204 also allows routing of high voltage signals back to memory chip 101, as illustrated by signal path 302 that connects a signal in a conductor in metal layer 204 to array structure 202-(1,1). FIG. 3 also shows areas 301-1, 301-2 and 301-3, which are projections of stripes 203-1, 203-2 and 203-3 onto the semiconductor substrate of companion chip 102. The gaps ("pocket areas") between adjacent pairs of areas 301-1, 301-2 and 301-3 are relatively large areas on the semiconductor substrate of companion chip 102.

Figure 4:
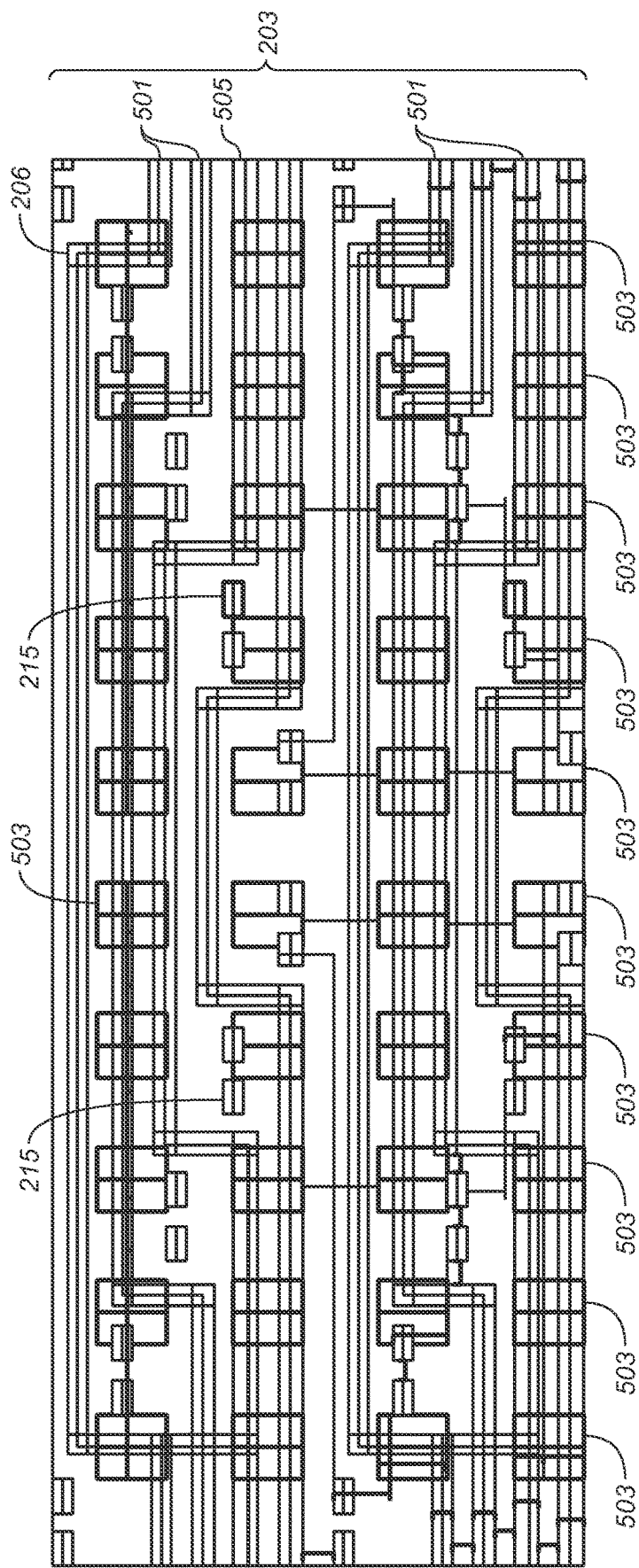
FIG. 4 shows a top view of companion chip 102, showing stripe 203 of hybrid bonds and metal layers 206.

FIG. 4 shows a top view of companion chip 102, showing stripe 203 of hybrid bonds and metal layer 206. As shown in FIG. 4, stripe 203 includes hybrid bonds 503. Certain ones of hybrid bonds 503 are used for routing the BLI nodes which are connected in companion chip 102 by conductor-filled vias ("BLI vias") 215. Signals routed on metal layers 204-207 must route around (i.e., "feed-thru" routing) around BLI vias 215, such as illustrated by conductor 505 on metal layer 206, which is seen to "jog" around two of BLI-node vias 215. Not shown in FIG. 4 are signal lines in metal layer 204 are provided to route the high voltage signals. Each high voltage signal is routed by a conductor between two grounded conductors on the same metal layer (i.e., metal layer 204) which provide additional shielding (in addition to the ground plane in metal layer 205, also not shown in FIG. 4). Interconnect conductors 501 are interconnect conductor in feed-thru metal layer 206.

Figure 5A:
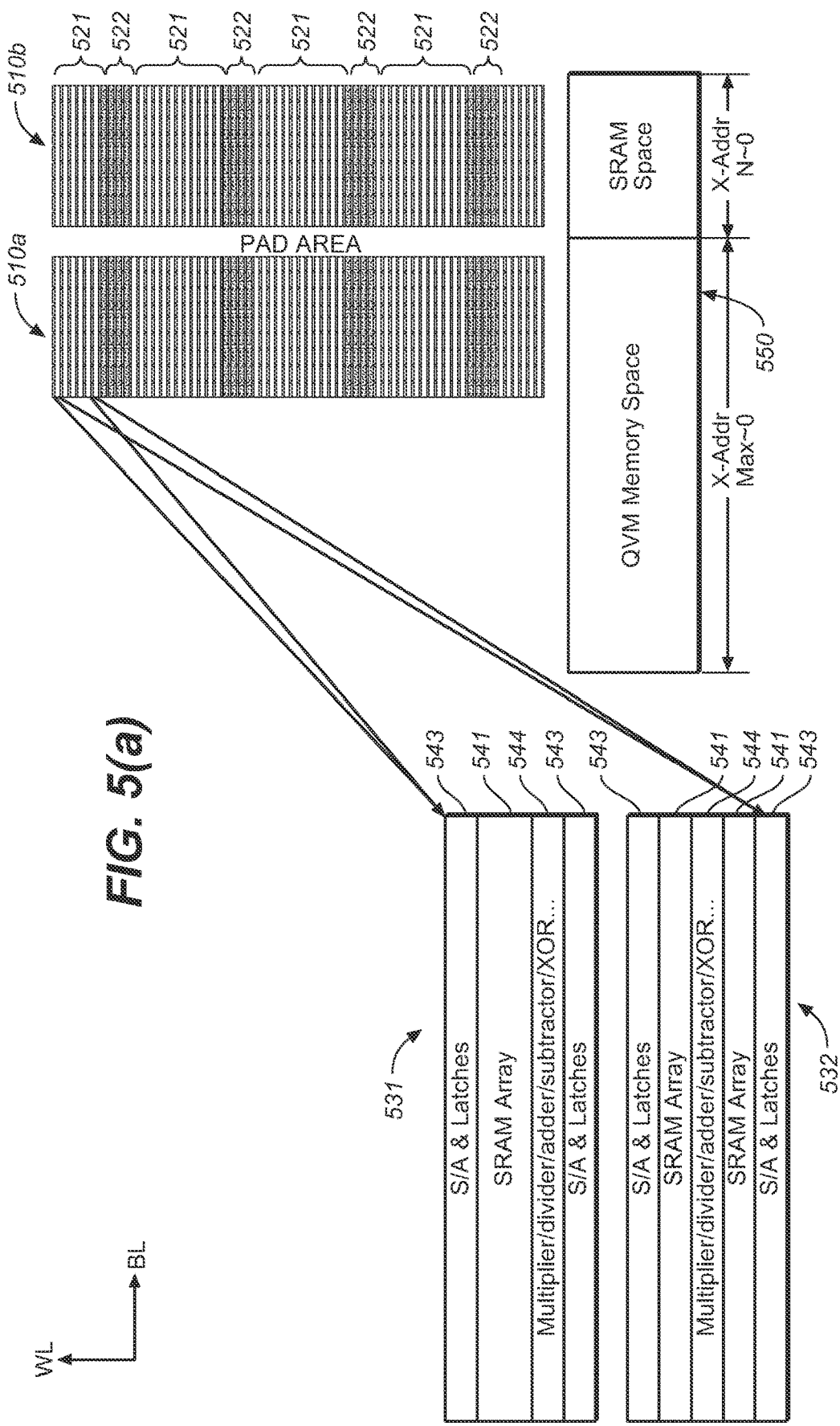
FIG. 5(a) illustrates sense amplifiers, latches, SRAM arrays and various logic circuitry formed at surface 212 of substrate 211 in companion chip 102, according to a first embodiment of the present invention.

According to one embodiment of the present invention, the pocket areas may be used for circuitry that enable integrated circuit 120 capabilities not previously available to memory circuits. For example, FIG. 5(a) shows circuitry at surface 212 of substrate 211 of companion chip 102, according to one embodiment of the present invention. FIG. 5(a) shows representative circuit module group 510a and 510b in circuitry at surface 212 of substrate 211 of companion chip 102 separated by an area ("pad area") that provides input and output interfaces of integrated circuit 120 (e.g., data input and output buses for communication with host processor 103). Each of circuit module group 510a and 510b includes a 2-dimensional array of circuit modules, with each column of circuit modules (i.e., along the WL direction) occupying the pocket areas between adjacent stripes of hybrid bonds. In FIG. 5a, each of circuit module groups 510a and 510b includes types 521 and 522 of circuit modules. Circuit module type 521 may be circuit modules each including volatile memory circuitry (e.g., SRAM arrays). Circuit module type 522 includes column decoder circuits servicing both adjacent memory bank groups in the volatile memory circuitry of the same column and quasi-volatile storage cells in corresponding array structures in memory chip 101 (i.e., specific tiles related by locality).

FIG. 5(a) also shows variation 531 and 532 of type 521 circuit modules. Each of variations 531 and 532 include one or more SRAM arrays 541 and sense amplifier and data latch circuitry 543. The sense amplifiers and data latches may each be shared among multiple memory cells in the memory array using multiplexers. Variation 531 may implement a single-ported SRAM array, while variation 532 may implement a dual-ported SRAM array.

In one embodiment, all the SRAM arrays 541 in companion chip 102 may occupy a different address space than the quasi-volatile storage cells in memory chip 101, as illustrated in address space map 550. In address space map 550, SRAM arrays 541 are mapped to lower addresses, while quasi-volatile storage cells in memory chip 101 are mapped to the higher addresses. Thus, the quasi-volatile storage cells and SRAM 541 together form an extended address space, integrating and sharing data lines within the same memory bank. The extended address space enables read and write operations to be serviced from SRAM 541, while a programming, erase or a refresh operation is in progress in the quasi-volatile memory circuits.

Optionally, the circuit modules may also additionally implement arithmetic and logic circuitry 544 (e.g., adders, multipliers, dividers, subtractors, RISC processors, math co-processors, and logic gates, such as XOR). A circuit module with both SRAM array and arithmetic and logic circuitry are particularly suitable for implementing in-memory and near-memory computation desired in many applications, such as machine learning, classification, neural networks and other AI application. Because of much higher bandwidth between SRAM array 541 and arithmetic and logic circuitry 544—i.e., data retrieved from and written back to memory are routed between the memory and the processing units over on-chip signal routing, without the limited bandwidth of a conventional memory interface bus (the "von Neuman bottle neck")—substantially greater performance is achieved, as compared with those of conventional processor architecture. With battery or capacity backup power, the SRAM arrays retain its data even during a period of power loss, thereby allowing unlimited access to the same data without conflict with the need to perform refresh operations, which is particularly suitable for storing system data, as well as application and operating system software. In addition, recursive computation operations for training in AI applications may be performed using large storage capacity of the quasi-volatile memory circuits and fast SRAM circuits. Furthermore, the quasi-volatile memory circuits may be part of a larger memory with both quasi-volatile and non-volatile memory sections, with the non-volatile memory section storing weights that do not change frequently.

Alternatively, SRAM arrays 541 may each be used as a cache for quasi-volatile storage cells in corresponding array structures in corresponding memory banks. Because memory chip 101 and companion chip 102 are interconnected by hybrid bonds, which can be organized to provide high-bandwidth internal data buses (e.g., a 256-bit or 1024-bit wide bus per tile) between corresponding quasi-memory circuits of memory chip 101 and SRAM arrays in companion chip 102, To implement the cache function, circuitry may be provided in each circuit module to directly transfer data from the memory banks over these high-bandwidth internal data buses to the corresponding SRAM arrays (e.g., a page at a time). In one embodiment, each SRAM array has a storage capacity of 64 kbits and serves as a cache for a quasi-volatile memory circuit 64 Mbits. In that embodiment, a row of 16 tiles (plus overhead) are activated together to provide a 2-Kbyte page that is loaded or written together. In this manner, a single activation at the corresponding quasi-volatile memory bank prefetches a data page (after sensing at the sense amplifiers) into SRAM array 541. If host processor 103 accesses data at conventional cache-line sizes (e.g., 64 bytes) and with locality of reference, each prefetch can service many read accesses. If SRAM array 541 maintains multiple pages of a corresponding quasi-volatile memory bank in memory chip 101, the effective read latency of integrated circuit 120—amortizing the activation time of the quasi-volatile memory bank over many host accesses—approaches the read latency of the SRAM array. The activation time of an SRAM bank (e.g., 2 ns or less) is very short relative to the activation time of the corresponding quasi-volatile memory circuit. Furthermore, write operations may be deferred until a page of the quasi-volatile memory bank cached in SRAM array 541 needs to be swapped out or "evicted".

As it is preferred and sometimes required in quasi-volatile memory arrays to write or erase a page at a time, such deferred write of cached data from SRAM array 541 is particularly favored from both the performance and endurance points of view. From the performance point of view, amortizing the write access time of the quasi-volatile memory bank over many host computer accesses provides integrated circuit 120 SRAM circuit-like performance. As a result, with a multi-page cache in SRAM array 541, the performance of the combined volatile and quasi-volatile memory is effectively the performance of SRAM memory circuit. In addition, as SRAM arrays dissipate minimal power when not actively read or written, integrated circuit 120 with both SRAM and quasi-volatile memory circuits is very energy efficient. As data is mostly operated on and accessed in the SRAM circuits, this combination of SRAM and quasi-volatile memory circuits reduces power consumption because there are fewer read, write and erase operations performed on the quasi-volatile memory circuits. With fewer read, write and erase operations performed on the quasi-volatile memory circuits, the frequencies of erase-inhibit disturbs, write-inhibit disturbs, and read-disturbs in the quasi-volatile memory are correspondingly reduced. As well, greater endurance is achieved, as the quasi-volatile memory cells have significantly less exposure to the high-voltage electric field stress under write and erase operations.

As mentioned in Non-provisional Applications I and II, quasi-volatile memory circuits require refresh operations to retain data beyond their retention times (e.g., minutes). Naturally, when a data read operation is being performed on a page of memory cells at a time the page is due for a refresh operation, a "refresh conflict" arise. One of ordinary skill in the art would understand that a refresh conflict (e.g., those occurring in DRAMs) is sometimes resolved by stalling the read operation until the refresh operation is complete. Refresh conflicts are therefore an overhead cost that adversely affect memory performance. However, using the SRAM arrays as cache for corresponding quasi-volatile memory arrays in the memory circuit, read operations are likely serviced out of the SRAM cache, rather than requiring an access to the quasi-volatile memory circuits, thereby substantially avoiding most refresh conflicts. As the retention times of quasi-volatile memory circuits are already relatively longer than DRAMs, using an SRAM cache in conjunction with a quasi-volatile memory, as provided by the present invention, the effective performance that can be achieved likely surpasses that of conventional memory systems, such as DRAMs.

A cache in the prior art consists primarily of fast dedicated memory circuits (e.g., SRAM or SRAM-like circuits) that is separated from the memory circuit which data it caches. Typically, such a cache has its own data path and address space, and so is unable or very restricted in its ability to also operate as another independent storage or memory circuit. However, as illustrated in FIG. 1(a), the SRAM arrays provided on companion chip 102 share data-paths and an address space with the quasi-volatile memory circuits of memory chip 101. Under such an arrangement, even when operating as a cache for the quasi-volatile memory circuit in memory chip 101 (i.e., being mapped into the quasi-memory circuit address space), the SRAM arrays may still serve as a fast-access memory circuit accessible from the separate SRAM address space discussed above. Furthermore, the cache and the fast-access memory operations can take place over shared data paths. As discussed above, access by host processor 103 is available for both cache access and fast memory access over input and output interface circuits 109 (e.g., an industry-standard DDR5 interface or a high-bandwidth memory (HBM) interface).

In one embodiment, the high-bandwidth internal data buses for data transfers between memory chip 101 and companion chip 102 may also be used for transferring data in a massively parallel fashion between SRAM arrays in companion chip 102. This facility is particularly advantageous for in-memory computation operations. These internal buses deliver large amounts of data per execution cycle to the high-speed logic, RISC processors, math co-processors, or arithmetic circuit modules on companion chip 102, without involving moving data over input and output interface 109. Such an arrangement allows host processor 103 to set up arithmetic or logic operations to be carried out by the logic or arithmetic circuit modules on companion chip 102, without the data having to move over input and output interface 109, thereby circumventing the proverbial "von Neuman bottleneck."

In one embodiment, the SRAM arrays in companion chip 102 are used as cache memory for the quasi-volatile memory circuits only in a one-to-one correlated cache mode (i.e., the addressable unit of storage, such as "page," is identical in both the quasi-memory array as in the SRAM arrays). However, such an approach may not be ideal for some applications. For example, an SRAM array in companion chip 102 may be configured to be address on a "page" basis, which may be 2 Kbytes, as in some embodiments discussed above. In some operating system software, a page may be defined to be 512 bytes or 1K bytes. As another example, under one industry standard, an addressable data unit based on the width of an industry standard memory interface bus (e.g., 128-bit) may be preferable. In one embodiment, a portion of an SRAM array may be configured to be addressed on a "page-by-page" basis, with the page size configurable, or any suitable addressable data unit to accommodate the requirements of host processor 103, an operating system, or any suitable application program. The addressing scheme may be fixed, or configurable by software, firmware, or based on host command at "run" time (i.e., dynamically) by setting configuration registers in companion chip 102, for example.

Because of the number of high-bandwidth internal data buses that are available, parallel multiple-bank (whether concurrent or non-concurrent) operations are possible. While large amounts of data are delivered for arithmetic and logic operations by the high-speed arithmetic or logic circuit modules on companion chip 102, the next set of data may be fetched in parallel from the quasi-volatile memory circuits in memory chip 101 to be loaded into SRAM arrays in companion chip 102. Organizing the SRAM arrays and the logic and arithmetic circuit modules in rows and columns, parallel computation tasks (e.g., those used in AI applications) may be various segments of the bank basis (e.g., less than all logical tiles at a time), on a tile column basis or on multiple banks at a time. This operation of the SRAM array may be controlled or allocated by firmware or circuitry (e.g., state machines) on companion chip 102 or by a command set issued by host processor 103.

In one embodiment, a bank of SRAM arrays may be organized into a tile array of 256 rows by 16 columns, such that a 256-bit internal data bus is associated with one column of the SRAM tiles. In that configuration, 16 parallel 256-bit arithmetic or logic operations may be carried out simultaneously for data associated with each bank. Furthermore, in one embodiment, the 16 columns may be divided into four bank segments, for example, such that the 16 parallel operations are 4 sets of different operations, each set corresponding to a bank segment. The SRAM arrays on companion chip 102 may also be organized as bank groups, with each bank group having multiple banks. Independent and parallel operations may be carried out on a bank-group basis. In this manner, the SRAM arrays in the memory chipset of the present invention can be easily allocated in many possible configurations to simultaneously carry out both cache operations and in-memory computation operations.

Figure 5B:
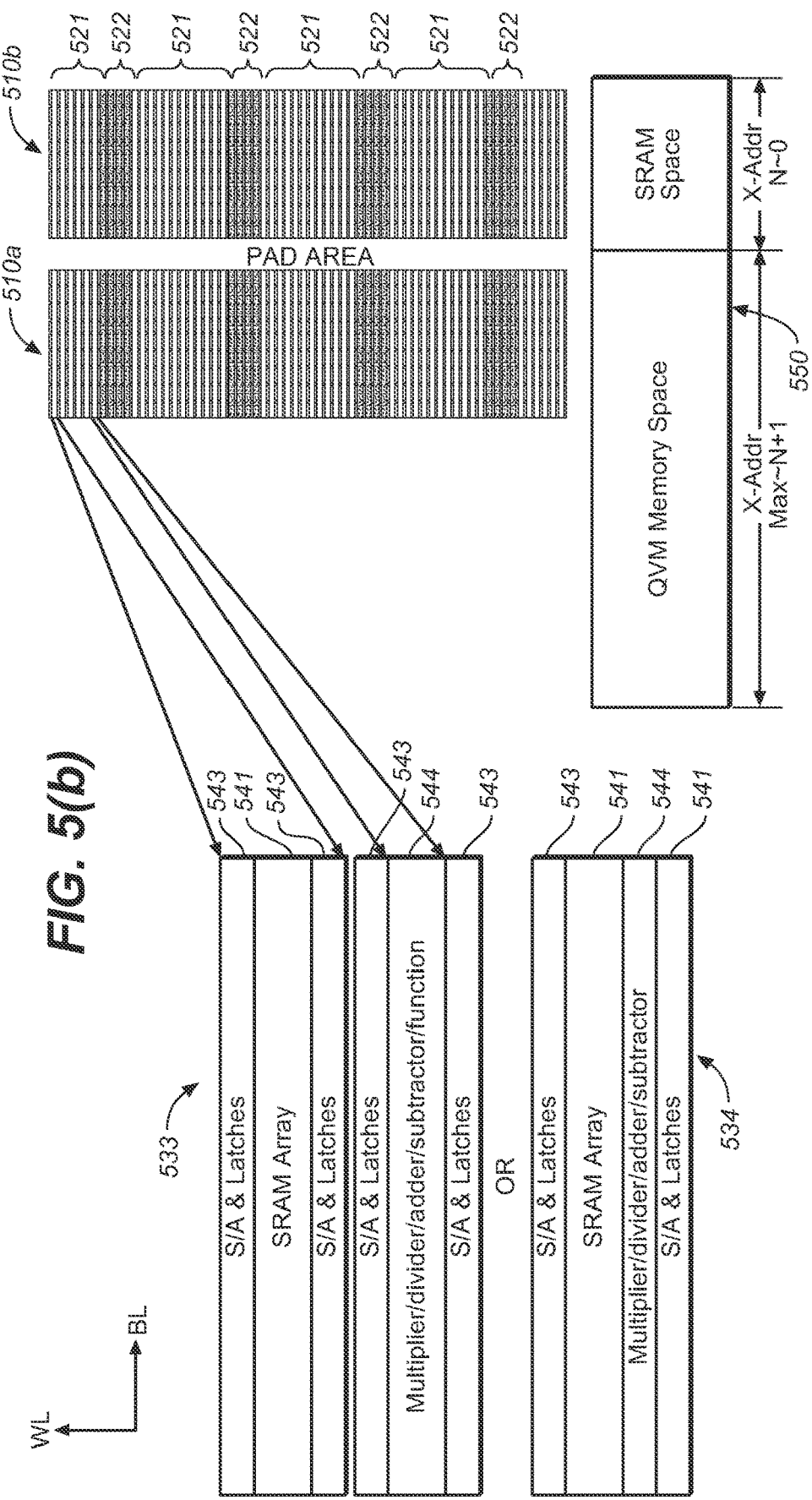
FIG. 5(b) shows sense amplifiers, latches, SRAM arrays and various logic circuitry at surface 212 of substrate 211 of companion chip 102, according to a second embodiment of the present invention.

FIG. 5(b) shows additional variations 533 and 534 that can be implemented for type 521 circuit modules of FIG. 5(a) at surface 212 of substrate 211 of companion chip 102, according to one embodiment of the present invention.

Some or all of the SRAM arrays 541 may be replaced by arrays of eDRAM, MRAM, phase-change memory, resistive random-access memory, conductive bridging random-access memory or ferro-electric resistive random-access memory, or any suitable combination of these circuits. Some of these memory arrays may provide comparable results in other embodiments of the present invention.

Figure 6:
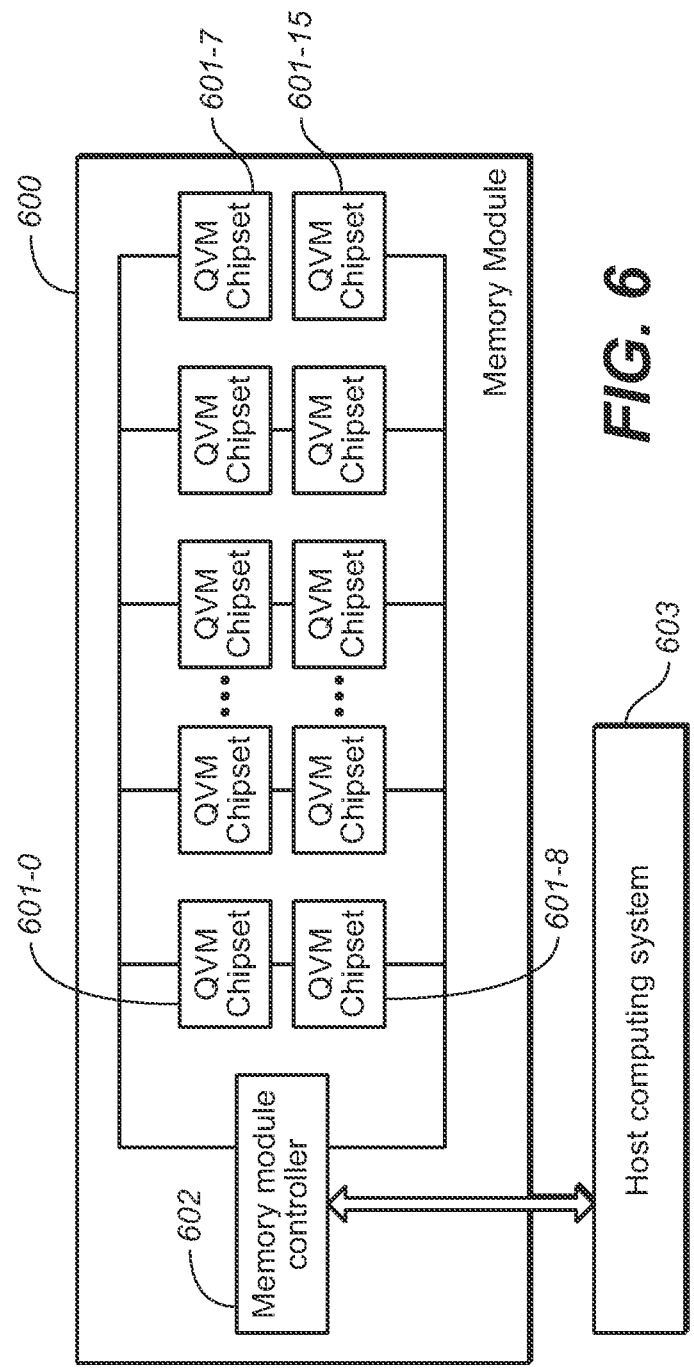
FIG. 6 generally illustrates memory module 600, according to one embodiment of the present invention, with memory chipsets 601-0 to 601-15 each including memory chip 101 and its companion chip 102 bonded together; the memory module may be provided in the format of a dual-in-line memory module (DIMM).

FIG. 6 generally illustrates memory module 600, according to one embodiment of the present invention, which may be provided in the format of a dual-in-line memory module (DIMM). As shown in FIG. 6, memory module 600 includes controller circuit 602 and memory chipsets 601-0 to 601-15, each of which may be a memory chip bonded to a companion chip (e.g., integrated circuit 102 described above). Memory module 600 may be mechanically attached to a printed circuit board on which electrical connection are provided (e.g., over an industry-standard data bus) to host computing system 603. Host computing system 603 may be any computing system, e.g., servers and mobile device, or any other suitable computing device (e.g., any telecommunication switch, router or gene sequencer). While FIG. 6 shows 16 memory chipsets, this number of memory chipsets is merely illustrative and is not intended to be limiting of the present invention. Memory module 600 may include memory chipsets of quasi-volatile memory circuits, in some embodiments, the chipsets may include both quasi-volatile memory circuits and non-volatile circuits, and circuits of another memory type (e.g. DRAM). The specific memory configuration may be optimized to accommodate the expected workloads and power requirements of host system 603. Controller circuit 602 may be provided as a separate integrated circuit. Controller 602 may be a conventional memory controller or may be specific to operations of chipsets with quasi-volatile memory circuits with on-chipset compute or mathematical operation functions.

Figure 7:
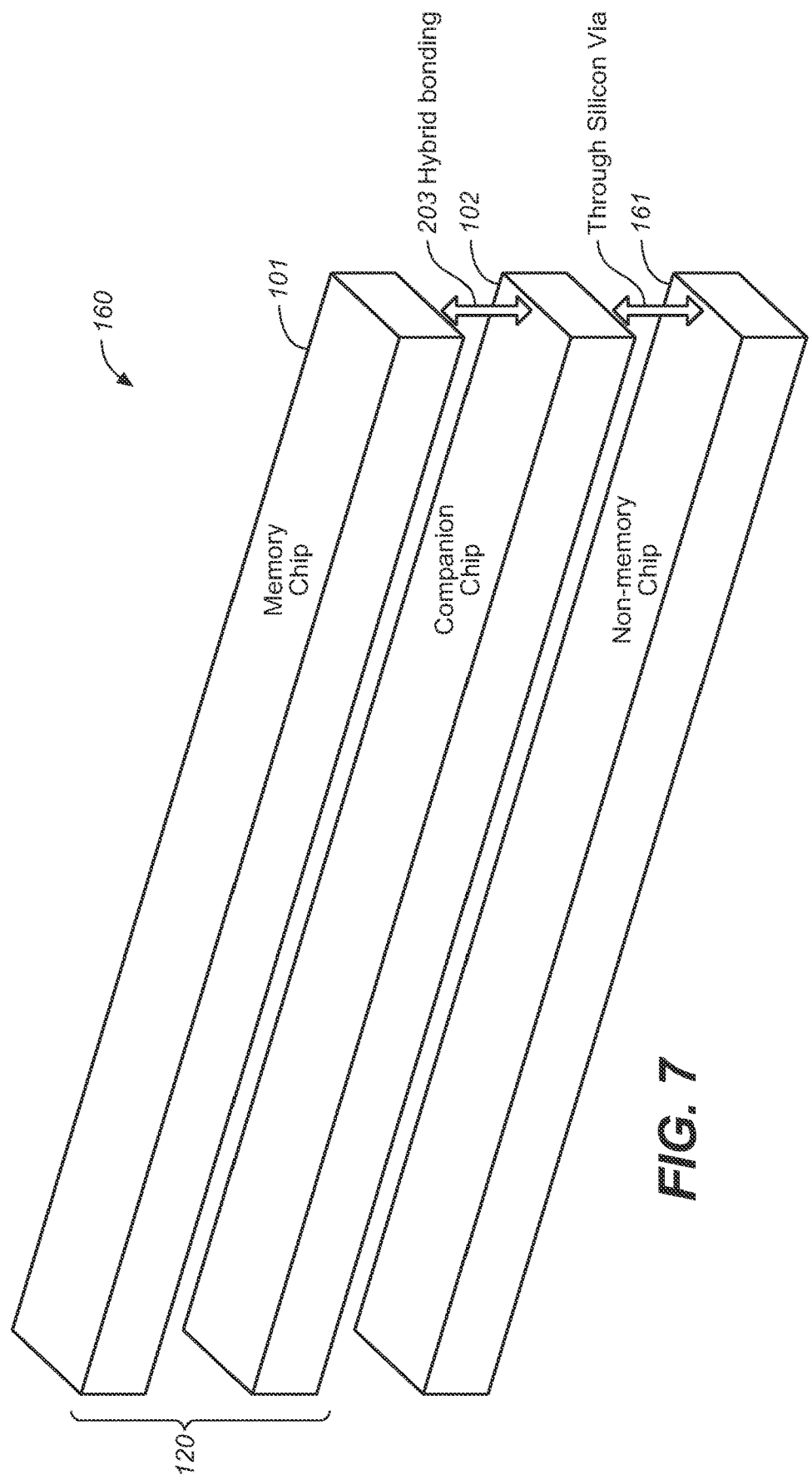
FIG. 7 illustrates integrated circuit 160, which includes memory chipset 120—formed by memory chip 101 and companion chip 102—and non-memory chip 161.

According to one embodiment of the present invention, FIG. 7 illustrates integrated circuit 160, which includes non-memory chip 161 and a memory chipset (e.g., chipset 120 above, which includes memory chip 101 and companion chip 102). Non-memory chip 161 may include one or more CPUs, GPUs, FPGAs, image sensors, baseband and other signal processors, ethernet and other data communication circuits, or any other suitable logic circuits. In integrated circuit 160, memory chipset 120 and non-memory chip 161 may be bonded together, signals between memory chipset and non-memory chip 161 electrically connected using, for example, through-silicon vias (TSVs), which improve signal communication speeds and reduce latency between memory chipset 120 and non-memory chip 161 during operation. Another embodiment may use another conventional interconnect, bond or bump technology. For example, memory chipset 120 and the non-memory chip 161 may be configured to use any suitable interface technique (e.g., DDR, HBM, or register-to-register data transfer techniques). An interface that implements a register-to-register data transfer protocol may optimize software or hardware performance (e.g., software of an operating system or application executing on a host computer system, or packet switching circuits in a telecommunication router).

Figure 8:
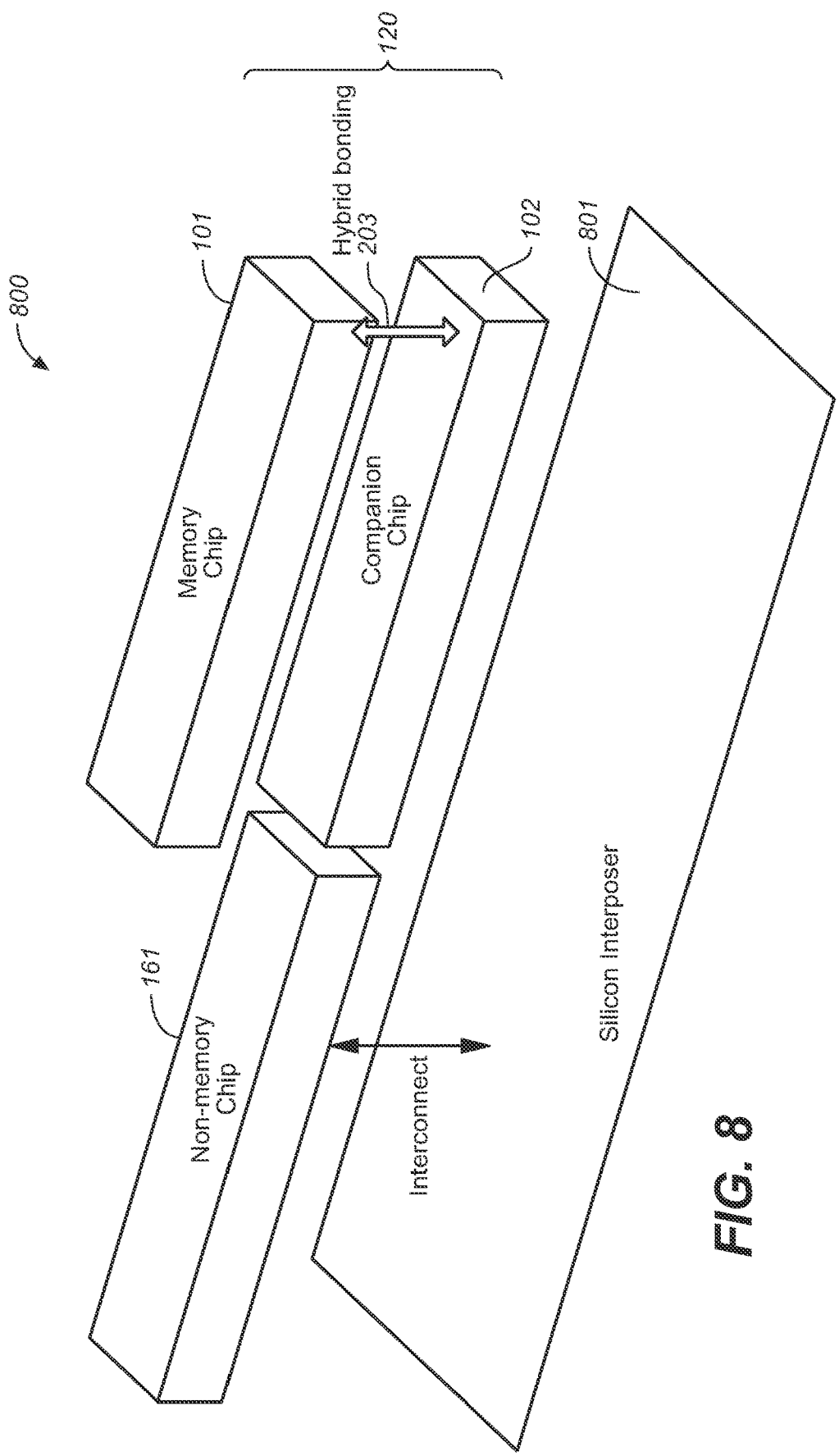
FIG. 8 shows memory chipset 120 and non-memory chip 161 interconnected by silicon interposer 801.

According to another embodiment of the present invention, as shown in FIG. 8, integrated circuit 800 includes memory chipset 120 and non-memory chip 161 interconnected by a silicon interposer, exemplified by silicon interposer 801 Silicon interposer 801 serve as a silicon substrate that provides interconnection conductors, in a manner similar to a printed circuit board. Silicon interposer 801 may provide electrical connections to additional memory chipsets and additional non-memory chips. Silicon interposer 801 provides the advantage of fast signal communication between the interconnected chips, while avoiding packaging challenges, such as heat dissipation.

Figure 9:
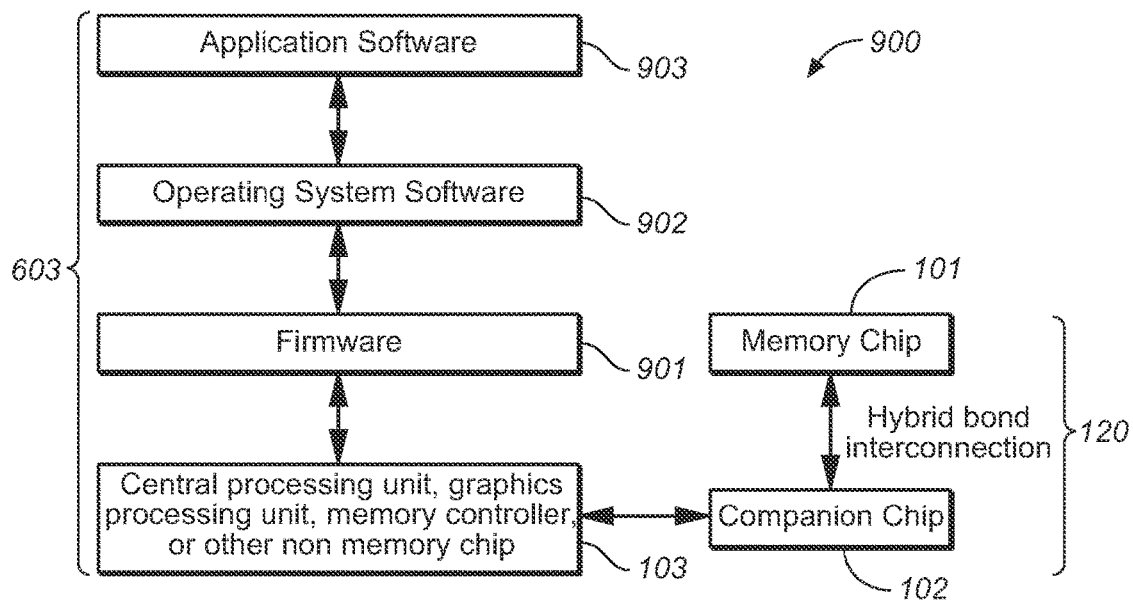
FIG. 9 is a schematic representation of computing system 900, which may be a subsystem within a larger host system (e.g., host system 603 of FIG. 6).

FIG. 9 is a schematic representation of computing system 900, which may be a subsystem within a larger host system (e.g., host system 603 of FIG. 6), for example. Computing system 900 may perform specialized applications (e.g. gene sequencing, telecommunication, or automotive and internet of things (IoT) applications). Computing system 900 illustrates that companion chip 102 may be customized and optimized to meet the workloads generated by software application 903, operating system 902, and firmware 901 of host processor 103. In computing system 900, SRAM arrays 107 or other buffer-type or cache-type memory circuits inside memory chipset 120 that are associated with quasi-volatile or non-volatile memory arrays 110 of memory chip 101 may be managed and configured outside memory chipset 120. Management optimization may be achieved, for example, by machine learning or digital signal processing techniques.

Figure 10:
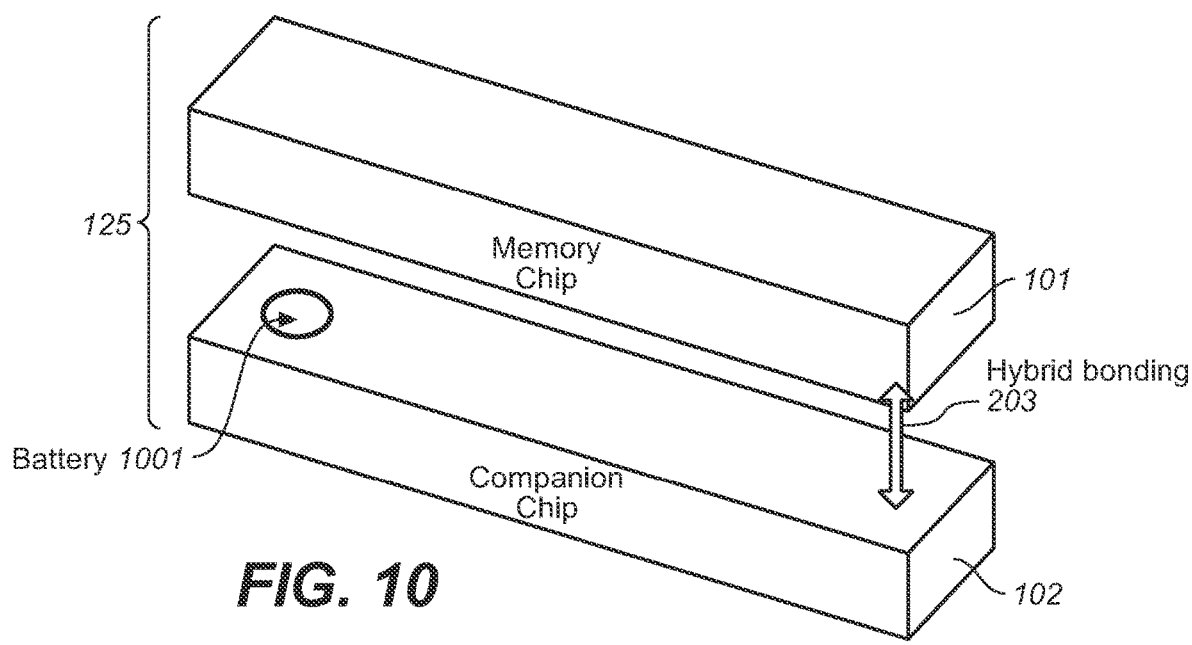
FIG. 10 in a schematic representation of memory chipset 125, which is provided battery 1001 on companion chip 102.

FIG. 10 in a schematic representation of memory chipset 125, which is provided battery 1001 or a capacitor on companion chip 102. Memory chipset 125 is advantageous for applications in which companion chip 102 stores system information (e.g., memory management information, including locations of bad blocks, lookup tables and registers). Memory chipset avoids loss of data when memory chipset 125 loses power. Battery 1001 retains data in any SRAM arrays or other volatile memory circuits on companion chip 102 or memory chip 101. In the event of a power loss, battery 1001, firmware on companion chip 102 and dedicated quasi-volatile or other non-volatile backup memory on memory chip 101 allow memory chipset 125 to write such system information (e.g., memory management information) into a non-volatile memory circuit. The stored system information may be recovered at the next power-up.

One advantage of the SRAM arrays on companion chip 102 is power conservation. The standard DDR5 for memory modules permits suspension of refresh operations, when the host system (e.g., host system 603 of FIG. 6) is idle. Some embodiments of the present invention allowing shutting down selected quasi-volatile memory blocks. When refresh suspension is permitted, a user may transfer critical data (e.g., firmware for the memory chipset or meta-data about the up-to-date status of the memory tiles) from the quasi-volatile memory circuits to the SRAM arrays, so that refresh operations on the quasi-volatile memory circuits may be suspended to conserve power. When power resumes, normal operations may be quickly restarted by the firmware in the SRAM arrays of the companion chip. Alternatively, refresh operations may be stopped for all quasi-memory circuits, except a selected few. Critical information for resumption of operations (e.g., the firmware for memory chipset) may be stored in the selected few blocks for which refresh operations are maintained.

Figure 11:
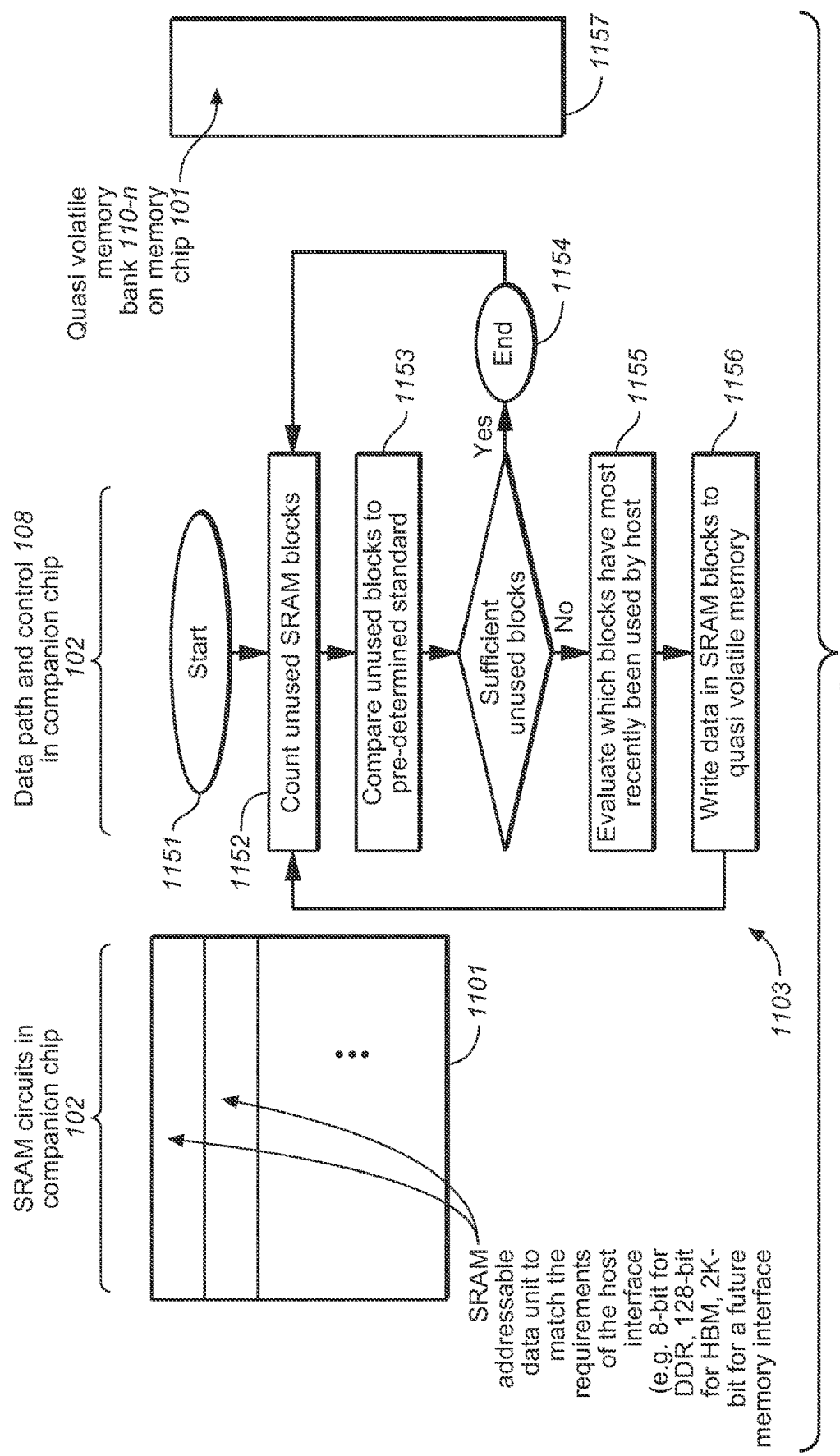
FIG. 11 schematically illustrates a paging system using the fast memory circuits (e.g., SRAM circuits) and the quasi-volatile memory circuits of integrated circuit 120, in accordance with one embodiment of the present invention.

Integrated Circuit 120 of the present invention may support a paging scheme in a virtual memory system, according to the present invention. FIG. 11 schematically illustrates a paging system using the fast memory circuits (e.g., SRAM circuits) and the quasi-volatile memory circuits of integrated circuit 120, in accordance with one embodiment of the present invention. Under the paging scheme of one embodiment, companion chip 102 keeps a suitable number of blocks of SRAM circuits 1101 (under a suitable block size, such as 1 byte, 64 bits, 128 bits, 2 Kbytes or any suitable addressable unit), based on the requirements of the intended application or operating system, to service the next incoming read or write command for data at specific locations associated with quasi-volatile memory circuits 1157 in memory chip 101 from host processor 103.

In FIG. 11, flow chart 1103 is provided to illustrate the operation of this paging system. Initially, at step 1151, a number of blocks of SRAM circuits 1101 ("memory blocks") are allocated. The blocks of SRAM circuits may be managed or allocated for this purpose using a page table and a suitable data structure, such as "heap," "stack," "list," or any other suitable data structure, as is known to those of ordinary skill in the art. To improve performance, as seen from host processor 103's perspective, a memory operation control circuit (e.g., a state machine-based control circuit) in data-path and control circuit 108 of companion chip 102 (see FIG. 1) may be provided. Recall that the actual write operation to quasi-volatile memory circuit 1157 may require up to, for example, 100 nanoseconds, even though the data may be read out from a copy stored in SRAM circuits 1101 over a very short time (e.g., 10 nanoseconds). Accordingly, companion chip 102 avoids stalling service to host processor 103 by scheduling the slower write operations to the quasi-volatile memory circuits 1157 in the background. In particular, a memory block holding data to be written in quasi-volatile memory circuit 1157 must be allowed to finish the write operation of its entire content into quasi-volatile memory circuits 1157. This requires having sufficient number of memory blocks available to service a suitable number of next incoming read or write commands from host system 103.

At step 1152, the memory operation control circuit determines the number of memory blocks that have not been allocated and, at step 1153, determines if the number of unallocated memory blocks exceeds a threshold. If so, at step 1154, there is sufficient unallocated memory blocks remaining without requiring a currently allocated memory block to write back its content to quasi-volatile memory 1157 to make room. Otherwise, at step 1155, a currently allocated memory block is selected based on an "eviction" policy and its data "evicted" or written back into the corresponding locations in quasi-volatile memory circuits 1157 in memory chip 101. A suitable eviction policy may be, for example, the 'least recently accessed" (i.e., the block among all allocated blocks that has not been read for the longest time). At step 1156, the data in the selected memory block is written back to the corresponding locations (as identified in the page tables) back to quasi-volatile memory circuits 1157. During this time, the memory operation control circuit monitors the "ready or busy" state of the applicable quasi volatile memory bank and when the bank is not busy, companion chip 102 deems the write operation complete and returns to step 1152. As there are sufficient unallocated memory blocks to handle the read and write access requests from host processor 103, while a number of incomplete write operations back to quasi-volatile memory 1157 may be proceeding in parallel, read and write requests form host processor 103 would not be stalled for an incomplete write operation.

The method represented by flow chart 1103 is applicable to and is advantageous for cache operations too. Of course, in a cache application, there is usually no need to select which memory block to write back.

While the above detailed description provides as HNOR memory string arrays (e.g., those described in Non-provisional Application II) as a primary example of quasi-volatile and non-volatile memory circuits on the memory chip. Other types of quasi-volatile and non-volatile memory circuits (e.g., the VNOR memory string arrays, described in Non-provisional Application III) also may be used in various embodiments of the present invention and achieves the advantages discussed above. For example, hybrid bonding allows the VNOR memory arrays the high-bandwidth interconnections to the SRAM arrays and the computation logic elements in the companion chip (e.g., SRAM circuits 541 and arithmetic and logic circuits 544 on companion chip 102 of FIGS. 5a and 5b). Whether HNOR memory string arrays or VNOR memory string arrays are used to provide quasi-volatile and non-volatile memory circuits, sense amplifiers and other high-performance, low-voltage logic circuitry may be implemented on the companion chip and electrically connected through the hybrid bonds to provide data, to take advantage of having the data from the sense amplifiers being in close proximity to both the SRAM circuits and the computation logic circuits.

The above detailed description is provided to illustrate specific embodiments of the present invention and is not intended to be limiting. Numerous variations and modifications of the present invention are possible. For example, in this detailed description and in the drawings, SRAM circuits are mentioned or used extensively to illustrate the present invention. However, the present invention is applicable to other fast memory circuits as well. The use of SRAM circuits to illustrate fast memory circuits herein is not intended to be limiting. The present invention is set forth in the accompanying claims.

We claim:

1. An integrated circuit, comprising:
a first semiconductor die having memory circuits of a first type formed thereon wherein memory circuits of the first type has at least one layer of memory cells formed above a substrate layer in the first semiconductor die; and
a second semiconductor die with memory circuits of a second type formed thereon, wherein memory circuits of the second type have a lower read latency than that of the memory circuits of the first type, and wherein the memory circuits of the first and second types are interconnected by wafer-level or chip-level bonding formed between the first and second semiconductor dies.

2. The integrated circuit of claim 1, wherein the wafer-level or chip-level bonding comprises one of: hybrid bonding, direct interconnection bonding, and micro-bump bonding.

3. The integrated circuit of claim 1, wherein the memory circuits of the first type comprise quasi-volatile memory circuits or non-volatile memory circuits and the memory circuits of the second type comprise one or more of: static random-access memory (SRAM) circuits, dynamic random-access memory (DRAM) circuits, embedded DRAM (eDRAM) circuits, magnetic random-access memory (MRAM) circuits, embedded MRAM (eMRAM) circuits, spin-transfer torque MRAM (ST-MRAM) circuits, phase-change memory (PCM), resistive random-access memory (RRAM), conductive bridging random-access memory (CBRAM), ferro-electric resistive random-access memory (FRAM), carbon nanotube and memory.

4. The integrated circuit of claim 3 wherein signals communicated between the first and second semiconductor dies are multiplexed and demultiplexed to share the bond interconnections.

5. The integrated circuit of claim 4, wherein a layer of conductors is provided on the second semiconductor die for allowing signals demultiplexed from the bond interconnections.

6. The integrated circuit of claim 3, wherein the quasi-volatile or non-volatile memory circuits each comprise one or more 3-dimensional arrays of NOR memory strings having at least one layer of quasi-volatile thin-film storage cells formed above a substrate layer of the first semiconductor die.

7. The integrated circuit of claim 6, wherein the NOR memory strings comprise VNOR memory strings.

8. The integrated circuit of claim 7, wherein the support circuit further comprises word line-related control circuits.

9. The integrated circuit of claim 8, wherein the word-line related control circuits comprise word-line decoders.

10. The integrated circuit of claim 6, wherein the NOR memory strings comprise HNOR memory strings.

11. The integrated circuit of claim 10, further comprising support circuitry formed under the 3-dimensional arrays at the surface of the substrate layer of the first semiconductor die.

12. The integrated circuit of claim 11, wherein the first and second semiconductor dies are bonded in a "flip-chip" or "face-to-face" orientation.

13. The integrated circuit of claim 12, wherein the first semiconductor die is bonded to a first surface on a first side of a substrate in the second semiconductor die and wherein the support circuitry in the second semiconductor die is fabricated at a second surface of the substrate on a second side of the substrate, the first and second sides being opposite sides of the substrate.

14. The integrated circuit of claim 13, wherein the substrate comprises an insulator.

15. The integrated circuit of claim 14, wherein the substrate is separated from a semiconductor wafer by cleaving, mechanical grinding or chemical etching.

16. The integrated circuit of claim 15, wherein the cleaving is accomplished by creating the insulator by implantation of oxygen atoms.

17. The integrated circuit of claim 14, wherein thru-silicon vias (TSV) are provided to connect the support circuitry to the wafer-level or chip-level bonds.

18. The integrated circuit of claim 11, further comprising selection transistors comprising vertical thin-film transistors for routing signals from memory circuits of the first type in the first semiconductor die to the wafer-level or chip-level bonds.

19. The integrated circuit of claim 11, wherein the support circuitry comprises voltage sources for reading, programming or erase.

20. The integrated circuit of claim 19, wherein the support circuitry further comprising logic circuits operating on voltages lesser in magnitude than voltages of the voltage sources for programming and erase.

21. The integrated circuit of claim 19, further comprising a first layer of conductors formed between the wafer-level or chip-level bonds and a planar surface of the second semiconductor die and wherein one or more signals generated by the voltage sources for reading, programming and erase are routed by the conductors of the first layer of conductors to memory circuits of the first type in the first semiconductor die.

22. The integrated circuit of claim 21, wherein each of the signals generated by the voltage sources for reading, programming and erase and routed by the conductors of the first layer of conductors and routed between grounded conductors that provide shielding.

23. The integrated circuit of claim 21, further comprising a second layer of conductors formed between the wafer-level or chip-level bonds and the first layer of conductors, wherein the conductors of the second layer of conductors are grounded to provide shielding of the memory circuits of the first type in the first semiconductor die from signals routed on the first layer of conductors.

24. The integrated circuit of claim 21, further comprising a second layer of conductors which distribute signals routed over the wafer-level and chip-level bonds interconnecting circuitry formed at a planar surface of the second semiconductor die.

25. The integrated circuit of claim 24, wherein through-silicon vias are formed on one or both of the second semiconductor die and the third semiconductor to provide signal paths.

26. The integrated circuit of claim 11, wherein the support circuitry further comprises selection transistors for routing signals from memory circuits of the first type to the wafer-level or chip-level bonds.

27. The integrated circuit of claim 11 wherein sense amplifiers for sensing memory circuits of the first type are formed at a planar surface of the second semiconductor die and connected to the memory circuits of the first type on the first semiconductor die through the wafer-level or chip-level bonds.

28. The integrated circuit of claim 1, wherein the second semiconductor die is fabricated under a manufacturing process optimized for fabricating CMOS logic circuits.

29. The integrated circuit of claim 1, wherein the second semiconductor die further comprising sense amplifiers, registers or data latches, and logic circuits formed thereon.

30. The integrated circuit of claim 1, wherein the memory circuits of the second type are modularized as memory modules ("second memory modules"), the integrated circuit further comprising on the second semiconductor die a plurality of internal data buses each providing read and write accesses to a group of the second memory modules.

31. The integrated circuit of claim 30, further comprising arithmetic and logic circuits formed on the second semiconductor die, wherein the arithmetic and logic circuits are modularized into logic modules and wherein the logic modules access the memory modules over the internal buses.

32. The integrated circuit of claim 31, wherein the memory circuits of the first type are each modularized as a memory modules ("first memory module"), and wherein each first memory module is connected by bonds to a data output circuit in the second semiconductor die dedicated to the first memory module, and wherein that dedicated data output circuit provides data from the first memory module to an associated one of the second memory modules.

33. The integrated circuit of claim 32, wherein the data output circuit comprises sense amplifiers.

34. The integrated circuit of claim 33, wherein the second memory module comprises a plurality of memory cells, a plurality of word lines and a plurality of bit lines for selecting the memory cells for read or write access, and wherein the memory module is configurable to perform as a bit-wise multiplier that receives as a first input operand the data value represented by a selected set of word lines and a second operand represented by a selected set of bit lines, wherein each asserted value of the first operand on the selected set of word lines causes a product term formed by shifting the second operand being written into the selected memory cells, and wherein each deasserted value of the first operand on the selected set of word lines causes a zero being written in the selected memory cells.

35. The integrated circuit of claim 34, wherein a plurality of the logic modules are provided to sum the product values written into the selected memory cells.

36. The integrated circuit of claim 32, further comprising, in the first semiconductor die, multiplexer circuits for selecting the data from the first memory module to be sent to the dedicated data output circuit.

37. The integrated circuit of claim 32, further comprising master-slave registers, provided between the data output circuits and the second memory modules, wherein a slave latch of each master-slave register holds a current data output of one of the data output circuits, while a master latch of each master-slave register receives the next data output from one of the data output circuits.

38. The integrated circuit of claim 32, wherein the dedicated data output circuit provides the data over the internal data buses of the associated second memory module in the second semiconductor die.

39. The integrated circuit of claim 32, wherein each logic module of the arithmetic and logic circuits is associated with one or more second memory modules, wherein the logic module accesses the associated second memory modules over the internal data buses of the associated second memory modules.

40. The integrated circuit of claim 32, wherein each second memory module is configured as one of: a dual-ported memory circuit and a single-ported memory circuit.

41. The integrated circuit of claim 32, wherein each logic module in the second semiconductor die is configured as one of: an adder circuit, a divider circuit, a Boolean operator circuit, a multiplier circuit, a subtractor circuit, a RISC processor, a math co-processor, and a multiplexer circuit.

42. The integrated circuit of claim 32, further comprising an on-chip control circuit in the second semiconductor die that controls operations of the second memory modules and logic modules.

43. The integrated circuit of claim 42, wherein the on-chip control circuit implements caching or paging of data from the memory circuits of the first type of the first semiconductor die in the memory circuits of the second type of the second semiconductor die.

44. The integrated circuit of claim 43, wherein the caching or paging of data is carried out using a block size determined by a page size fixed in the memory circuits of the first type.

45. The integrated circuit of claim 44, wherein the caching or paging of data is carried out using a programmable block size.

46. The integrated circuit of claim 45, wherein the programmable block size is one of a plurality of block sizes each corresponding to units of data transfer in one or more industry-standard memory interface protocols.

47. The integrated circuit of claim 45, wherein the programmable block size is set by a host processor.

48. The integrated circuit of claim 43, wherein the on-chip control circuit allocates the fast memory circuits in blocks, maintaining at least a predetermined number of unallocated blocks.

49. The integrated circuit of claim 48, wherein when the number of unallocated blocks falls below the predetermined number, the on-chip control circuit selects one of the allocated blocks for data transfer to the memory circuits of the first type.

50. The integrated circuit of claim 49, wherein the on-chip control circuit selects the block for data transfer based on an "eviction" policy.

51. The integrated circuit of claim 49, wherein the on-chip control circuit monitors the data transfer to the memory circuits of the first type and schedules data transfer out of the cache based on whether one or more previous data transfers are completed.

52. The integrated circuit of claim 51, wherein the data transfer are performed in an integral multiple of a programmable block size.

53. The integrated circuit of claim 42, further comprising a memory interface formed in the second semiconductor die accessible by a host processor and data paths that connect among the first and second memory modules and the logic modules and the memory interface.

54. The integrated circuit of claim 53, wherein the memory interface comprises an industry-standard memory interface.

55. The integrated circuit of claim 53, wherein the host processor accesses the first and second memory modules over the memory interface using an access scheme that is based on mapping the first memory modules and the second memory modules, respectively, to first and second non-overlapping portions of addresses in an address space.

56. The integrated circuit of claim 55, wherein hot data or metadata are stored and read from memory at addresses in the second portion of the address space.

57. The integrated circuit of claim 56, wherein the second memory module from which the data is retrieved is allocated to serve as cache memory for the first memory module to which the address is mapped.

58. The integrated circuit of claim 55, wherein the host processor requests data from a location in the memory circuits in the first semiconductor die by presenting an address for the location as mapped to the address space, and wherein the on-chip control circuit provides, as the requested data, data retrieved from the second memory module.

59. The integrated circuit of claim 58, wherein the first memory modules are organized as memory banks, and wherein the second memory modules serving as cache memories for first memory modules of a memory bank in the first semiconductor die form a corresponding memory bank in the second semiconductor die.

60. The integrated circuit of claim 59, wherein, in both the semiconductor dies, each first or second memory module occupies a 2-dimensional area ("tile") on its respective semiconductor die.

61. The integrated circuit of claim 60, wherein each tile in the first semiconductor die is mapped one-to-one onto a corresponding tile in the second semiconductor die, and wherein one or more signals from each tile in the first semiconductor die are provided to circuitry at a substrate of the corresponding tile by the wafer-level or chip-level bonding, and thru-silicon vias.

62. The integrated circuit of claim 61, wherein the one-to-one mapping maps a tile in the first semiconductor die to the tile in the second semiconductor die that is closest in proximity.

63. The integrated circuit of claim 60, wherein each tile comprises a fast memory circuit section, in which the fast memory circuits are placed, and one or more data output sections, in which the data output circuits are placed, provided on one or both sides of the fast memory circuit section.

64. The integrated circuit of claim 63, wherein the fast memory circuits in the fast memory circuit section serve as cache memory for the memory circuits of the first type in the corresponding tile in the first semiconductor die.

65. The integrated circuit of claim 60, wherein the tiles are arranged on each semiconductor die in a formation of rows and columns, and wherein each internal bus on the second semiconductor die provides read and write access to second memory modules in a column of tiles.

66. The integrated circuit of claim 65, wherein each logic module also occupies a tile.

67. The integrated circuit of claim 66, wherein the tile are arranged to form one or more computing units, each computing unit comprising a first plurality of contiguous rows of the tiles in the second semiconductor die each comprising one of the second memory modules ("fast memory module tiles"); a second plurality of contiguous rows of the tiles in the second semiconductor die each comprising a logic module ("logic module tiles"), and a plurality of computing data buses each facilitating data transfer among the fast memory module tiles and the logic module tiles.

68. The integrated circuit of claim 67, wherein each computing unit further comprises, for each fast memory module tile, a corresponding tile in the first semiconductor die that comprises quasi-volatile or non-volatile memory circuits ("QV memory module tile") connected to the fast memory module tile through data output circuits, such that the computing data buses further facilitates data transfer among the data output circuits of the to the QV memory module tiles, the fast memory module tiles and the logic module tiles.

69. The integrated circuit of claim 68, wherein the each computing unit is configurable to implement a neural network having neurons each parameterized by a matrix of parameter values stored in the fast memory module tiles, wherein input data is stored as vectors in the QV memory module tiles, and wherein the logic modules implement matrix multiplications between the matrices of parameter values and the vectors.

70. The integrated circuit of claim 67, wherein each computing data bus connects the fast memory module tiles and the logic module tiles that are column-aligned tiles.

71. The integrated circuit of claim 67, wherein the computing units have first and second configurations, wherein each logic module tile in the first configuration is closer in proximity to its closest fast memory module tile than how close each logic module tile in the second configuration is to its closest fast memory module tile.

72. The integrated circuit of claim 67, wherein each logic module tile comprises one of: a central processing unit (CPU) core, a graphics processing unit (GPU) core, field-programmable gate arrays (FPGAs), and an embedded controller.

73. A computing system comprising a plurality of the integrated circuits of claim 67 interconnected by a memory interface bus, wherein a subset of the integrated circuits are configured to operate in a pipelined manner.

74. The computing system of claim 73, wherein a first subset of integrated circuits are configured such that the quasi-volatile or non-volatile memory circuits comprise NOR memory strings that perform a logical function.

75. The computing system of claim 74, wherein the first subset of integrated circuits implements one or more content-addressable memory circuits.

76. The computing system of claim 75, wherein the first subset of the integrated circuits are further configured to perform a parallel search function over the content addressable memory circuits.

77. The computing system of claim 73, wherein a second subset of integrated circuits are configured to perform data-intensive computations.

78. The computing system of claim 77, wherein the computing system is configured to transfer results of the data-intensive computations to be used in the parallel search function over the content-addressable memory circuits.

79. The integrated circuit of claim 65, wherein each memory bank includes first or second memory modules spanning a plurality of rows and a plurality of columns of tiles.

80. The integrated circuit of claim 79, wherein a plurality of memory banks form a bank group, the bank group further comprises a first data bus accessible by each of the memory banks within the bank group.

81. The integrated circuit of claim 80, wherein the integrated circuit comprises a plurality of the bank groups, wherein the integrated circuit further comprising a second data bus accessible by each of the bank groups, and wherein each of the bank groups within each bank accesses the second data bus through the first data bus of its own bank group.

82. The integrated circuit of claim 79, wherein the data associated with memory circuits in one row of tiles within a bank form a page of data, and wherein each data transfer between a bank in the first semiconductor die and the corresponding bank in the second semiconductor die comprises an integral number of pages of data.

83. The integrated circuit of claim 59, wherein the host processor comprises a central processing unit, a graphics processing unit, a field programmable gate array, or a memory controller.

84. The integrated circuit of claim 59, wherein the memory circuits of the first type comprise quasi-volatile memory circuits or non-volatile memory circuits, and the memory banks are each configured to allow reading from the fast memory circuits associated with the memory bank while the quasi-volatile or non-volatile memory of the memory bank is being refreshed, programmed or erased.

85. The integrated circuit of claim 59, wherein the memory circuits of the first type comprise quasi-volatile memory circuits or non-volatile memory circuits, and the memory banks are each configured to allow reading from the fast memory circuits associated with the memory bank while the quasi-volatile or non-volatile memory of the memory bank is being written into.

86. The integrated circuit of claim 42, wherein the on-chip control circuit configures the memory modules and the logic modules to carry out computation operations on data of a programmable block size.

87. The integrated circuit of claim 86, wherein the programmable block size is any one of: 4-bit and integral multiples thereof, up to 2 Kbytes.

88. The integrated circuit of claim 42, wherein the memory modules and the logic modules on the second integrated circuit are modularized into tiles each occupying a predetermined area on the second semiconductor die, and wherein the tiles are functionally organized into banks, and wherein the on-chip control circuit configures in-memory computations to be carried out on a tile-by-tile basis, bank-by-bank basis or on a multi-bank basis.

89. The integrated circuit of claim 31, wherein the logic modules each operate on data read from a selected group of one or more second memory modules over the internal data buses.

90. The integrated circuit of claim 89, wherein the second memory modules are each configurable to serve as cache memory to a corresponding first memory module or as data memory accessed by logic module during operations of the logic module.

91. The integrated circuit of claim 90, wherein data transferred from the first memory module delivered through its dedicated data output circuit are provided on the internal data buses accessible by the corresponding logic modules.

92. The integrated circuit of claim 91, further comprising an on-chip control circuit in the second semiconductor die, wherein the operations of each logic module, the transfer of data from the first memory module, and the read and write accesses to the second memory module are controlled by the on-chip control circuit executing on a prescribed software and firmware command set.

93. The integrated circuit of claim 91, wherein data transfer operations between first memory modules and the corresponding second memory modules are performed under control of a host processor over a memory interface.

94. The integrated circuit of claim 93, wherein the memory interface comprises an industry-standard memory interface.

95. The integrated circuit of claim 1, further comprising non-memory circuits formed on a third semiconductor die, wherein the third semiconductor die is bonded to the second semiconductor die to allow the non-memory circuits and circuitry on the second semiconductor die to be electrically interconnected.

96. The integrated circuit of claim 95, where the non-memory circuits are part of a computing system.

97. The integrated circuit of claim 96, wherein the computing system comprises one or more of: central processing units, graphics processing unit, memory controllers, RISC processors, math co-processors, servers, mobile devices, telecommunication switches, routers and gene sequencers.

98. The integrated circuit of claim 1, further comprising non-memory circuits formed on a third semiconductor die, wherein the second and third semiconductor dies are both bonded to a silicon interposer substrate to allow the non-memory circuits and circuitry on the second semiconductor die to be electrically interconnected by conductors formed in the silicon interposer substrate.

99. The integrated circuit of claim 98, wherein the non-memory circuits are part of a computing system.

100. The integrated circuit of claim 99, wherein the computing system comprises one or more of: central processing units, graphics processing unit, memory controllers, RISC processors, math co-processors, servers, mobile devices, telecommunication switches, routers and gene sequencers.

101. The integrated circuit of claim 1, further comprising a battery that supplies backup power to the integrated circuit.

102. A memory module having an input and output interface, comprising:
 a plurality of the integrated circuits, wherein one of the integrated circuits is provided by the integrated circuit of claim 1; and a controller managing the integrated circuits so as to provide access to the integrated circuits over the input and output interface.

103. The memory module of claim 102, wherein the memory module conforms to a dual-inline memory module format.

104. An integrated circuit, comprising:
a first semiconductor die, comprising:
quasi-volatile or non-volatile memory circuits formed above a planar surface of a substrate of the first semiconductor die; and
support circuit for the quasi-volatile memory circuits formed at the planar surface of the substrate; and
a second semiconductor die, comprising:
fast memory circuits having a read latency less than the read latency of the quasi-volatile memory circuits;
logic circuits capable of accessing the fast memory circuits to carry out in-memory computations;
an input and output bus for an external processor to access and to configure the fast memory circuit, the logic circuits, and the quasi-volatile memory circuits; and
logic circuit configurable for applications requiring high-capacity memory; and
wherein the first semiconductor die and the second semiconductor die are bonded using hybrid bond or thru-silicon vias techniques, wherein the first semiconductor die is fabricated under a first manufacturing process optimized for the support circuitry; and wherein the second semiconductor dies is fabricated under a second manufacturing process supporting low-voltage, high performance CMOS circuitry.

105. A semiconductor die, comprising: (i) quasi-volatile memory circuits formed above a planar surface of a substrate of the semiconductor die; (ii) support circuit for the quasi-volatile memory circuits formed at the planar surface of the substrate;
and (iii) a modularized bonding interface that allows bonding using hybrid-bonding or through-silicon via techniques with any one of a plurality of companion semiconductor dies, wherein the companion semiconductor dies each including one with an application-specific configurable circuit formed therein.

106. A companion semiconductor die configured for bonding with the semiconductor die of claim 105, comprising:
fast memory circuits having a read latency less than the read latency of the quasi-volatile memory circuits;
arithmetic and logic circuits capable of accessing the fast memory circuits to carry out in-memory computations;
an internal data bus accessible by the arithmetic logic circuits to perform in-memory computations; and
an input and output bus for an external processor to access and to configure the fast memory circuit, the logic circuits, and the quasi-volatile or non-volatile memory circuits;
wherein the internal data bus and the input and output bus operate independently of, and simultaneous with, each other.

\* \* \* \* \*